US 6,663,976 B2

(12) United States Patent
Beach et al.

(10) Patent No.: US 6,663,976 B2
(45) Date of Patent: Dec. 16, 2003

(54) LAMINATE ARTICLES ON BIAXIALLY TEXTURED METAL SUBSTRATES

(75) Inventors: David B. Beach, Knoxville, TN (US); Jonathan S. Morrell, Knoxville, TN (US); Mariappan Paranthaman, Knoxville, TN (US); Thomas Chirayil, Knoxville, TN (US); Eliot D. Specht, Knoxville, TN (US); Amit Goyal, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/175,684

(22) Filed: Jun. 20, 2002

(65) Prior Publication Data
US 2002/0178999 A1 Dec. 5, 2002

Related U.S. Application Data

(60) Division of application No. 09/409,120, filed on Sep. 30, 1999, now Pat. No. 6,440,211, which is a continuation-in-part of application No. 08/922,173, filed on Sep. 2, 1997, now Pat. No. 6,077,344.

(51) Int. Cl.[7] .............................................. B32B 15/04
(52) U.S. Cl. ...................... 428/469; 428/472; 428/689; 428/697; 428/699; 428/701; 428/702
(58) Field of Search ................. 428/469, 472, 428/689, 697, 699, 702, 701

(56) References Cited

U.S. PATENT DOCUMENTS

| 4,920,093 | A | | 4/1990 | Nonaka et al. |
|---|---|---|---|---|
| 5,146,299 | A | | 9/1992 | Lampe et al. |
| 5,159,413 | A | | 10/1992 | Calviello et al. |
| 5,198,269 | A | | 3/1993 | Swartz et al. |
| 5,470,668 | A | | 11/1995 | Wu et al. |
| 5,585,694 | A | | 12/1996 | Goldburt et al. |
| 5,741,377 | A | | 4/1998 | Goyal et al. |
| 5,872,080 | A | | 2/1999 | Arendt et al. |
| 5,898,020 | A | * | 4/1999 | Goyal et al. ................. 505/239 |
| 5,968,877 | A | * | 10/1999 | Budai et al. ................. 505/237 |
| 6,077,344 | A | | 6/2000 | Shoup et al. |
| 6,150,034 | A | * | 11/2000 | Paranthaman et al. ...... 428/472 |
| 6,156,376 | A | | 12/2000 | Paranthaman et al. |
| 6,270,908 | B1 | | 8/2001 | Williams et al. |

FOREIGN PATENT DOCUMENTS

| JP | 57-193357 | 11/1982 |
|---|---|---|
| JP | 7-228866 | 8/1995 |

OTHER PUBLICATIONS

A. Goyal, et al., "High Critical Current Density Superconducting Tapes by Epitaxial Deposition of $YBa_2Cu_3O_x$ Thick Films on Biaxially Textured Metals", Appl. Phys. Lett. 69:1795 (Sep. 16, 1996).

X.D. Wu, et al., "Properties of $YBa_2Cu_3O_{7-\delta}$ Thick Films on Flexible Buffered Metallic Substrates" Appl. Phys. Lett. 67 (16):2397 (Oct. 16, 1995).

(List continued on next page.)

Primary Examiner—Deborah Jones
Assistant Examiner—Stephen Stein
(74) Attorney, Agent, or Firm—Akerman Senterfitt

(57) ABSTRACT

A laminate article comprises a substrate and a biaxially textured $(RE^1_xRE^2_{(1-x)})_2O_3$ buffer layer over the substrate, wherein $0<x<1$ and $RE^1$ and $RE^2$ are each selected from the group consisting of Nd, Sm, Eu, Ho, Er, Lu, Gd, Tb, Dy, Tm, and Yb. The $(RE^1_xRE^2_{(1-x)})_2O_3$ buffer layer can be deposited using sol-gel or metal-organic decomposition. The laminate article can include a layer of YBCO over the $(RE^1_xRE^2_{(1-x)})_2O_3$ buffer layer. A layer of $CeO_2$ between the YBCO layer and the $(RE^1_xRE^2_{(1-x)})_2O_3$ buffer can also be include. Further included can be a layer of YSZ between the $CeO_2$ layer and the $(R^1_xRE^2_{(1-x)})_2O_3$ buffer layer. The substrate can be a biaxially textured metal, such as nickel. A method of forming the laminate article is also disclosed.

10 Claims, 20 Drawing Sheets

OTHER PUBLICATIONS

J.V. Cathcart, et al. "The Structure of Thin Oxide Films Formed on Nickel Crystals" J. Electrochem. Soc. 116:664 (1969) (No Month).

V. Sandu et al. "$LaAlO_3$ Thin Films Deposited on Silicon and Sapphire as Buffer Layers for $YBa_2Cu_3O_{7-x}$" J. Mater. Sci. Lett. 13:1222–1225 (1994) (No Month).

S.S. Shoup, et al. "Growth of Epitaxial $LaAlO_3$ and $CeO_2$ Films Using Sol–Gel Precursors", Proceedings of the $10^{th}$ Anniversary HTS Workshop on Physics, Materials and Applications, pp. 134–135 (1996) (No Month).

K. Kushida, et al. "Origin of Orientation on Sol–Gel–Derived Lead Titanate Films" J. Am. Ceram. Soc. 76(5):1345–1348 (1993) (No Month).

A.E. Lee, et al. "Epitaxially Grown Sputtered $LaAlO_3$ Films", Appl. Phys. Lett. 57(19):2019–2021 (1990) (No Month).

M. Kawasaki "Atomic Control of the $SrTiO_3$ Crystal Surface" Science 266:1540–1542 (Dec., 1994).

P. Peshev, et al. "Preparation of Lanthanum Aluminate Thin Films by a Sol–Gel Procedure Using Alkoxide Precursors" Mater. Res. Bull. 29(3):255–261 (1994) (No Month).

* cited by examiner

LAMINATE ARTICLES ON BIAXIALLY TEXTURED METAL SUBSTRATES

CROSS-REFERENCE TO RELATED APPLICATION

This is a Divisional of application Ser. No. 09/409,120, filed Sep. 30, 1999, now U.S. Pat. No. 6,440,211 which itself is a Continuation-In-Part of application Ser. No. 08/922,173 filed Sep. 2, 1997, now U.S. Pat. No. 6,077,344.

STATEMENT REGARDING FEDERALLY SPONSORED RESEARCH AND DEVELOPMENT

The United States Government has rights in this invention pursuant to Contract No. DE-AC05-00OR22725 between the United States Department of Energy and UT-Battelle, LLC.

FIELD OF THE INVENTION

This invention relates to biaxially textured metal oxide buffer layer on metal substrates. More specifically, the invention relates to a non-vacuum process for depositing single epitaxial films of rare-earth oxides on metal substrates.

BACKGROUND OF THE INVENTION

Biaxially textured metal oxide buffer layers on metal substrates are potentially useful in electronic devices where an electronically active layer is deposited on the buffer layer. The electronically active layer may be a superconductor, a semiconductor, or a ferroelectric material.

For example, the next generation of superconducting wire to be used for power transmission lines will have a multi-layer composition. Such deposited conductor systems consist of a metal substrate, buffer layer, and a superconducting layer. The metal substrate, such as Ni, Ag, or Ni alloys, provides flexibility and support for the wire. Metal oxide buffer layers, such as cerium oxide ($CeO_2$), or yttria-stabilized zirconia (YSZ), comprise the next layer and serve as chemical barriers between the metal substrate and the top layer, the high-temperature superconductor.

For a superconducting film to carry a high current, a certain degree of alignment between grains of the superconductor is required. Most preferably, the grains should be aligned both perpendicular to the plane of the substrate (c-axis oriented) and parallel to the plane of the substrate (a-b alignment). To achieve this alignment, high $T_C$ superconductors have generally been deposited on (100) oriented single-crystal oxide substrates. However, single-crystal substrates are generally too expensive and have poor mechanical properties. As such, single-crystal substrates are presently unsuitable as practical conductors.

A method to develop practical coated conductors is disclosed in U.S. Pat. No. 5,741,377 ('377) by Goyal et al. This method called RABiTs, short for rolling assisted biaxially textured substrates, uses roll-texturing of metal to form a metallic tape with a {100}<001> cubic structure. However, if the metal is nickel or a nickel alloy, a buffer layer between the metal substrate and the ceramic superconductor is necessary to prevent interdiffusion of the ceramic superconductor and the metal substrate and also to prevent the oxidation of nickel substrate during the deposition of the superconducting layer. Useful buffer layers include cerium oxide, yttrium stabilized zirconia (YSZ), strontium titanium oxide, rare-earth aluminates and various rare-earth oxides.

To achieve high critical current densities, it is important that the biaxial orientation be transferred from the substrate to the superconducting material. As stated, a biaxially textured metal substrate can be provided by the method disclosed in the '377 patent. The conventional processes that are currently being used to grow buffer layers on metal substrates and achieve this transfer of texture are vacuum processes such as pulsed laser deposition, sputtering, and electron beam evaporation. Researchers have recently used such techniques to grow biaxially textured $YBa_2Cu_3O_x$ (YBCO) films on metal substrate/buffer layer samples that have yielded critical current densities ($J_C$) between 700,000 and $10^6$ A/cm$^2$ at 77° K. (A. Goyal, et al., "Materials Research Society Spring Meeting, San Francisco, Calif., 1996; X. D. Wu, et al., *Appl. Phys. Lett.* 67:2397, 1995). One drawback of such vacuum processes is the difficulty of coating long or irregularly shaped substrates, and the long reaction times and relatively high temperatures required.

A further consideration during the fabrication process is the undesirable oxidation of the metal substrate (for example, when using Ni). If the Ni begins to oxidize, the resulting NiO will likely to grow in the (111) orientation regardless of the orientation of the Ni (J. V. Cathcart, et al., *J. Electrochem. Soc.* 116:664, 1969). This (111) NiO orientation adversely affects the growth of biaxially textured layers and will be transferred, despite the substrate's original orientation, to the following layers.

For producing high current YBCO conductors on {100}<001> textured Ni substrates, high quality buffer layers are necessary. Buffer layers such as $CeO_2$ and YSZ have previously been deposited using pulsed laser ablation, e-beam evaporation, and sputtering. In addition, solution techniques have been used to deposit films of rare-earth aluminates on biaxially textured nickel substrates. However, the rare-earth aluminates had c-axis alignment but has always given a mixture of two epitaxies (100)[001] and (100)[011]. This is a structure believed to be unsuitable for growth of high critical current YBCO films.

SUMMARY OF THE INVENTION

It is an object of the invention to provide a new and improved method for fabricating alloy and laminated structures having epitaxial texture.

It is another object of the invention to provide a method to produce epitaxial superconductors on metal alloys and laminated structures having epitaxial texture.

It is yet another object of the invention to provide a non-vacuum process to produce epitaxial buffer layers on metal substrates.

It is a further object of the invention to provide a process for growing rare-earth oxide buffer layers with single in-plane epitaxy.

Another object of the invention is to provide an epitaxial textured laminate using rare-earth oxides.

Still another object of the invention is to provide an epitaxial textured superconducting structure having a $J_C$ of greater than 100,000 A/cm$^2$ at 77 K and self-field.

Yet another object of the invention is to provide a solution process for producing single cube oriented oxide buffer layers, such as cerium oxide.

These and other objects of the invention are achieved by the subject method and product.

BRIEF DESCRIPTION OF THE DRAWINGS

There are shown in the drawings embodiments of the invention that are presently preferred, it being understood, however, that the invention is not limited to the precise arrangements and instrumentalities shown, wherein:

FIG. 7a is the (222) pole figures observed for a 600 Å thick $Gd_2O_3$ film on Ni (100) substrate.

FIG. 7b is the orientation image micrograph of the film in FIG. 7a.

FIG. 7c is the orientation image micrographs on the film in FIG. 7b with different gray scale shadings.

DETAILED DESCRIPTION OF THE INVENTION

Figure 1:
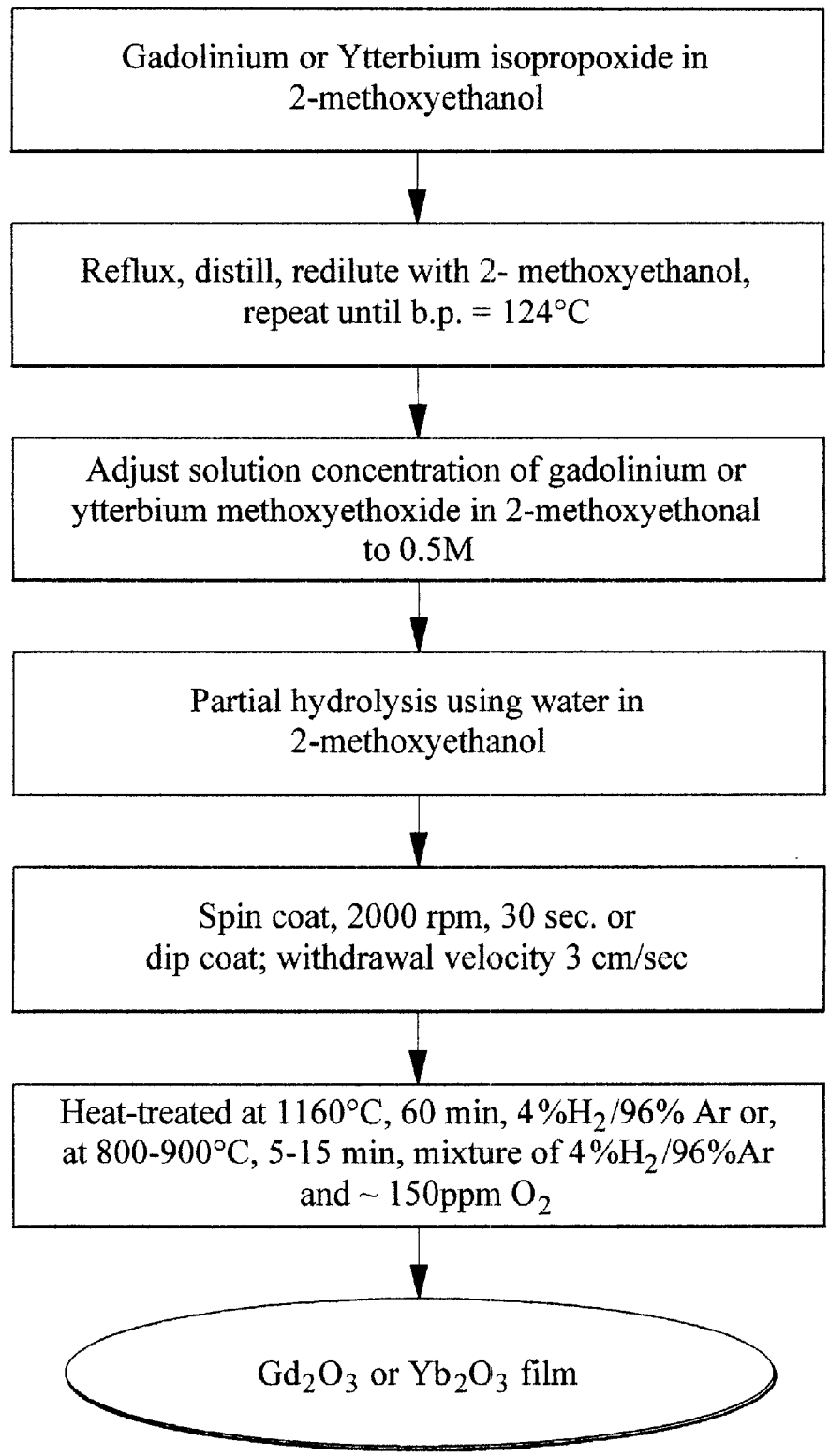
FIG. 1 is a flow diagram illustrating method steps according to a first embodiment of the invention.
Figure 2:
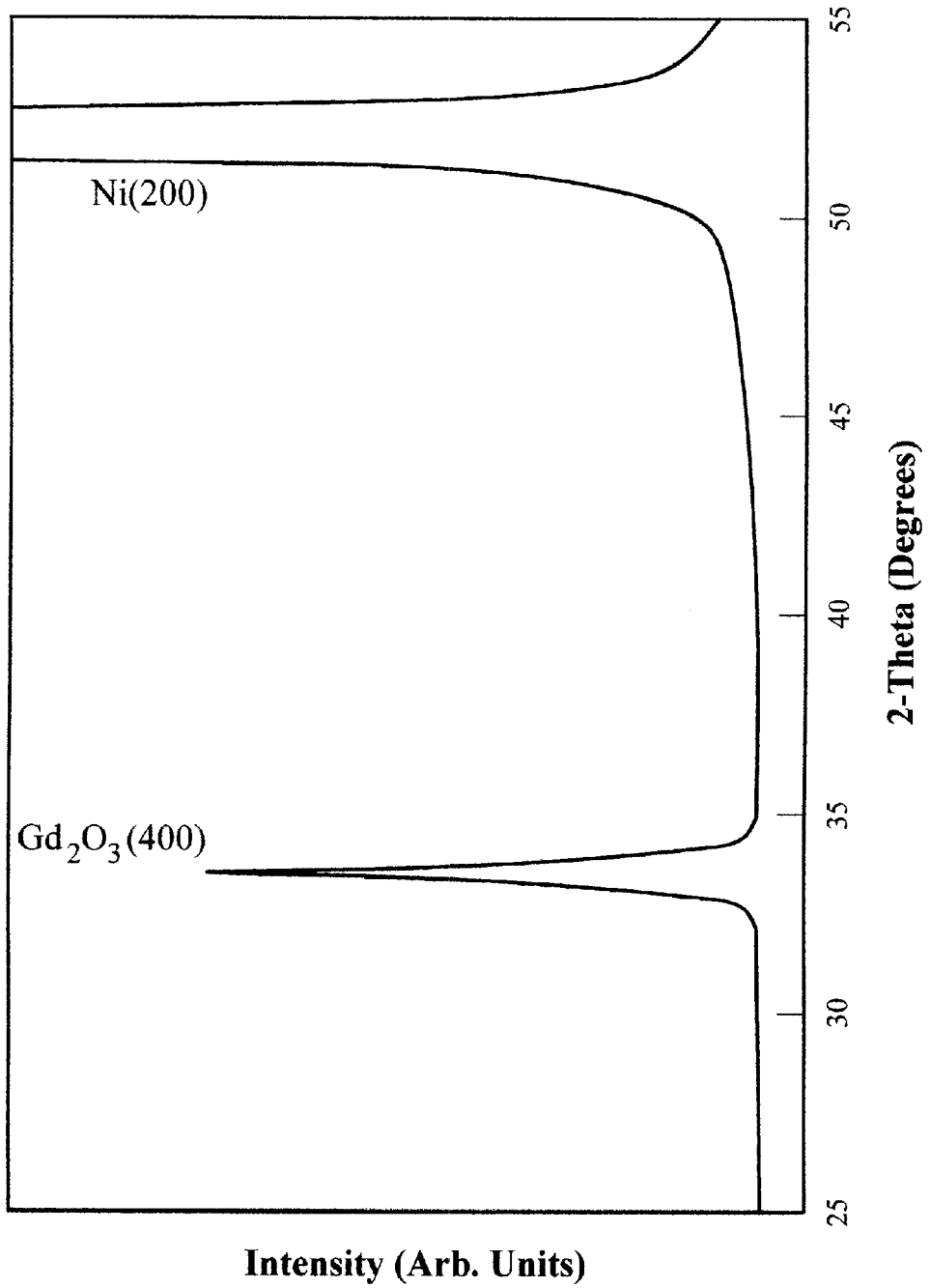
FIG. 2 is a theta-2-theta scan of the c-axis oriented $Gd_2O_3$ film on Ni {100}<001> substrate.
Figure 3:
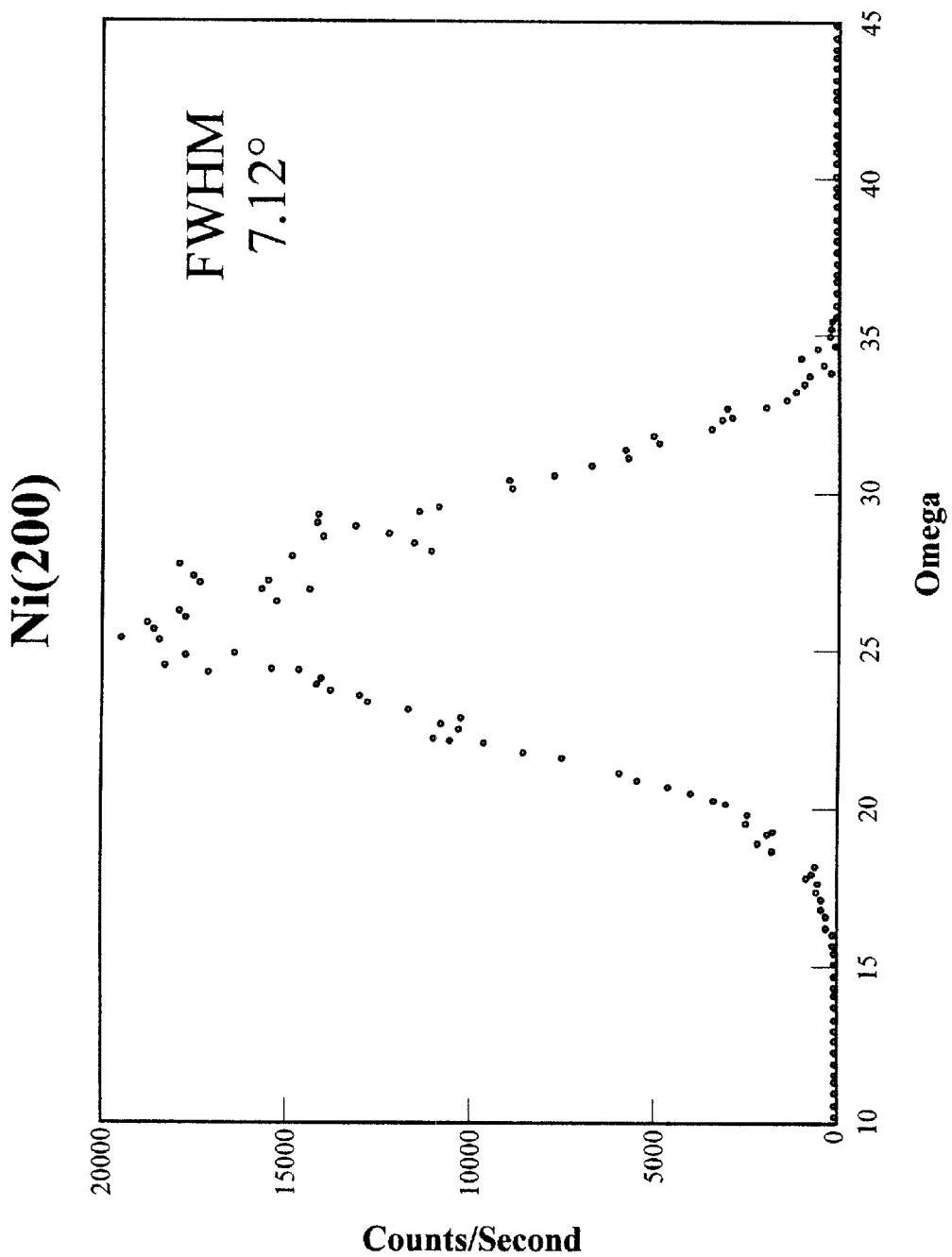
FIG. 3 is an omega scan of the Ni (002) reflection (FWHM=7.12°) of a 600 Å thick $Gd_2O_3$ film on a roll-textured Ni substrate.
Figure 4:
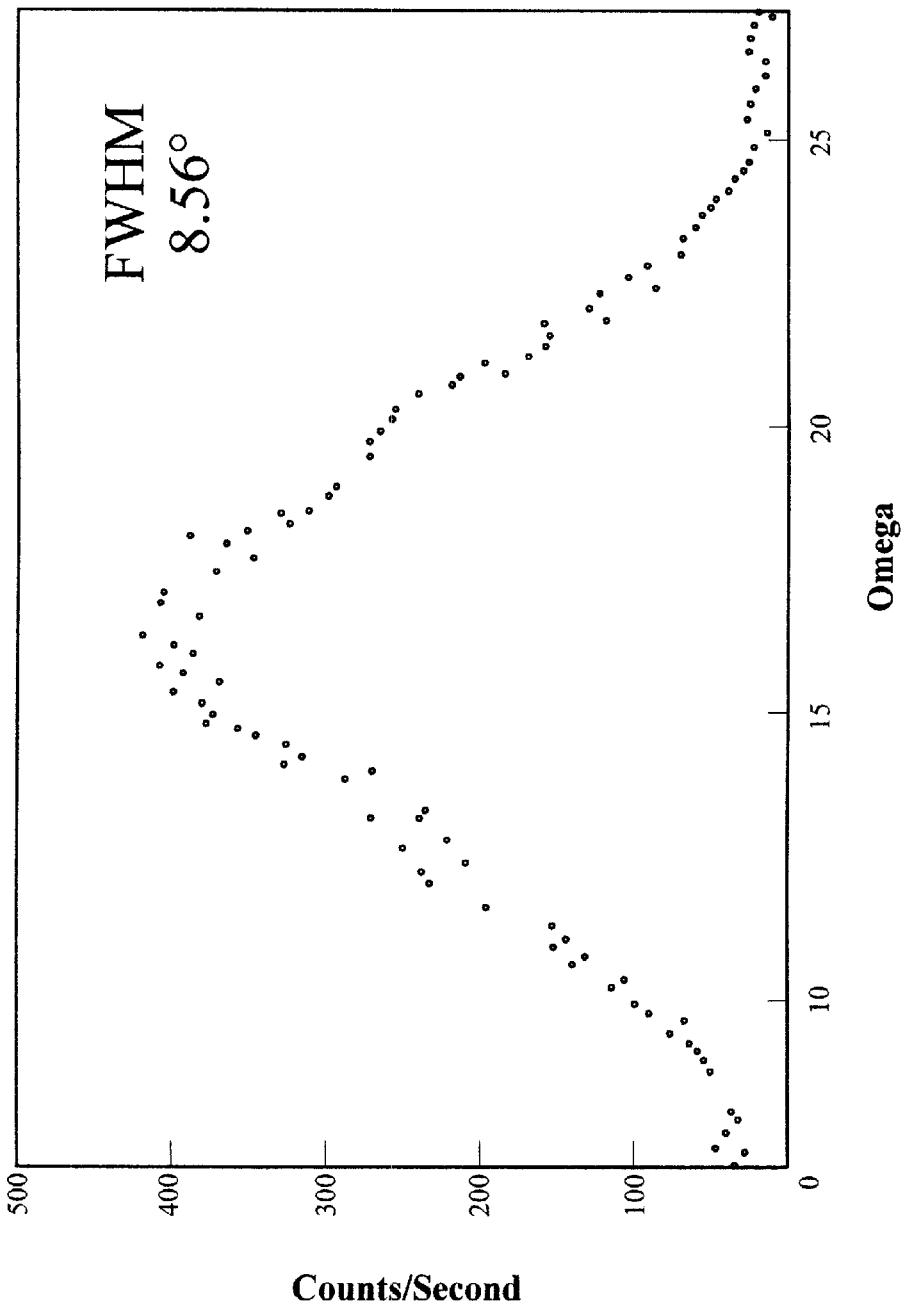
FIG. 4 is an omega scan of the $Gd_2O_3$ (004) reflection (FWHM=8.56°) of a 600 Å thick $Gd_2O_3$ film on a roll-textured Ni substrate.
Figure 5:
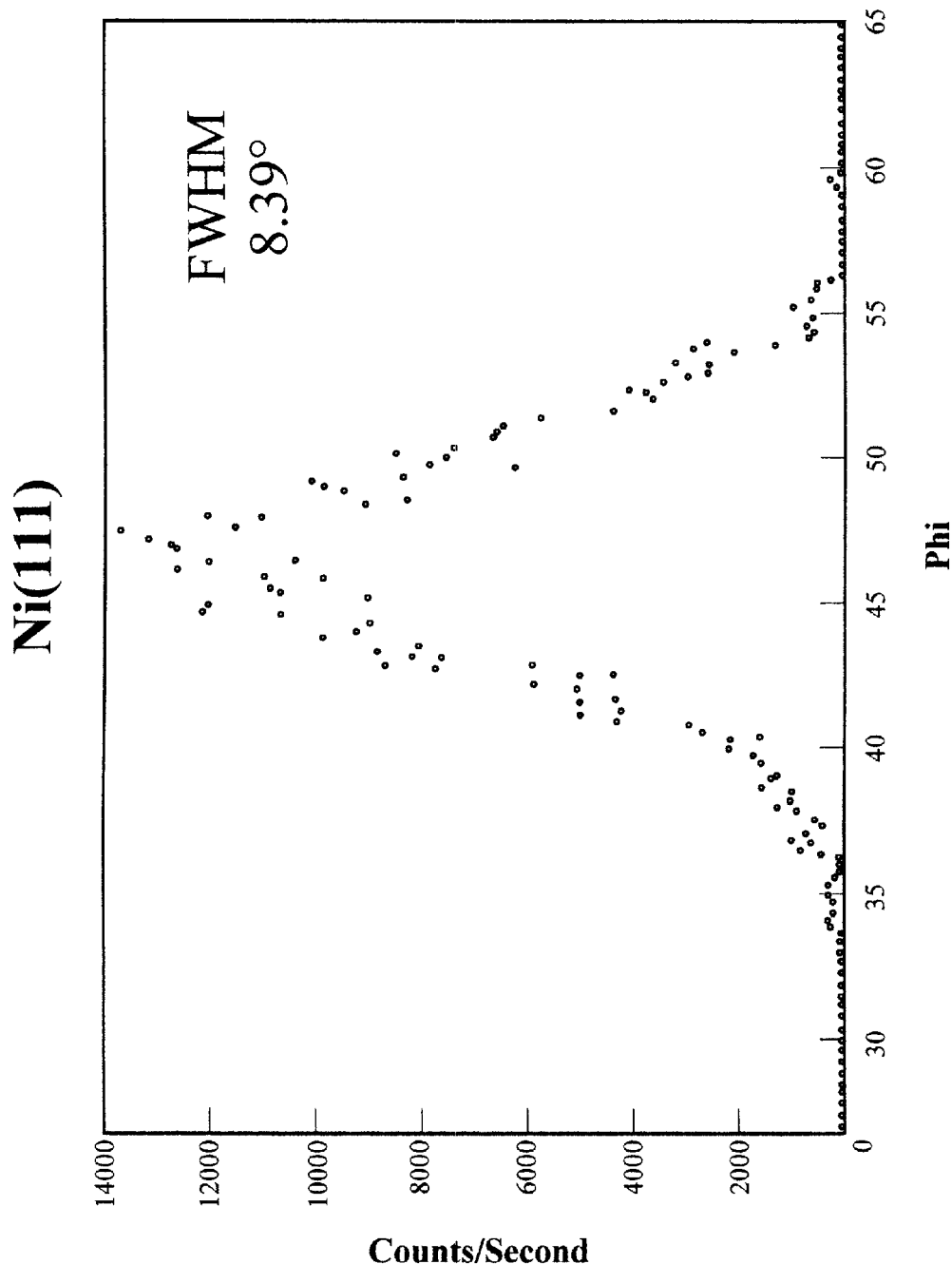
FIG. 5 is a phi scan of the Ni (111) reflection (FWHM=8.39°) of a 600 Å thick $Gd_2O_3$ film on roll-textured Ni substrate.
Figure 6:
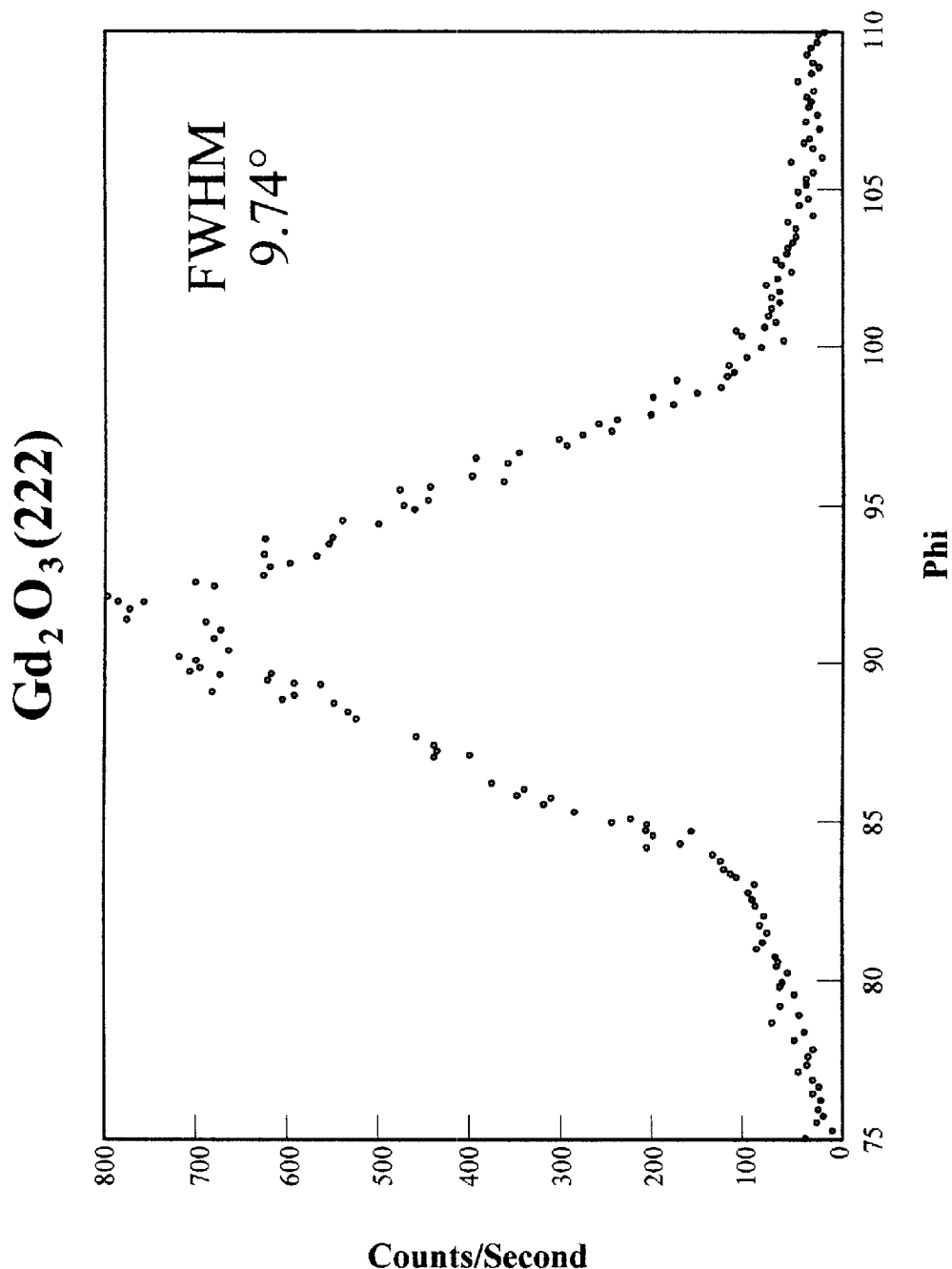
FIG. 6 is a phi scan of the $Gd_2O_3$ (222) reflection (FWHM=9.74°) of a 600 Å thick $Gd_2O_3$ film on a roll-textured Ni substrate.

Referring to FIG. 1, a method for depositing single epitaxial films of rare-earth oxides on metal substrates, according to the present invention, is illustrated. The method comprises preparing a biaxially textured metal substrate, preparing a rare-earth oxide coating solution, coating the metal substrate with the coating solution, and heat treating the metal substrate and solution to pyrolyze the coating solution and to form a rare-earth oxide on the substrate.

PREPARE SUBSTRATE

Any method of preparing a biaxially textured metal substrate is acceptable for use with this invention. However, the presently preferred method of preparing the biaxially textured metal substrate is disclosed in U.S. Pat. No. 5,741,377 by Goyal et al., which is incorporated herein by reference. The biaxial texture is achieved, for example, by cold rolling high purity (99.99%) nickel rod in a rolling mill until the length of the rod had been increased by a factor of about 20 (deformation was over 95%). The desired cubed texture {100}<001> was developed by recrystallization of the rolled Ni at 800° C. for 60–120 minutes at a pressure less than $10^{-7}$ torr or at 900° C. for 60 minutes in a flow of 4% $H_2$/Argon gas mixture. Other preferred materials include, but are not limited to copper, iron, aluminum, and alloys containing any of the foregoing, including nickel.

CLEAN SUBSTRATE

Prior to coating the metal substrate with the rare-earth oxide coating solution, the metal substrate is preferably cleaned to remove any organics on the metal substrate. Any method of removing organics from the metal substrate is acceptable for use with this invention. For example, the organics can be removed by methods such as vacuum annealing, electro-polishing, or reverse sputtering. However, the presently preferred method of removing organics from the metal substrate is to ultrasonically clean the metal substrate in a cleaning solution.

Any cleaning solution capable of being used during ultrasonification is acceptable for use with this invention; however, the presently preferred cleaning solution is isopropanol. The invention is not limited as to a particular length of time in which the metal substrate is ultrasonically cleaned so long as the organics are removed from the metal substrate. A preferred range of time is between about 5–60 minutes, and a most preferred length of time is about 60 minutes.

PREPARE SOLUTION

Many different methods of preparing a coating solution for use with the invention are known. Three commonly used solution preparation techniques are as follows: (i) sol-gel processes that use metal alkoxide complexes in alcohol solution; (ii) hybrid processes that use chelating agents such as acetylacetonate or diethanolamine to reduce alkoxide reactivity; and (iii) metal-organic decomposition (MOD) techniques that use high-molecular-weight precursors and water-insensitive carboxylates, 2-ethyl-hexanoates, naphthanates, etc. in an organic solvent. Although the coating solution can be prepared using any of these methods, any method capable of producing a coating solution capable of being coated on a metal substrate and subsequently capable of forming a rare-earth oxide on the substrate is acceptable for use with this invention. Additionally, the coating solution can be prepared using any combination of the three methods discussed above or with any other method that requires solution precursors.

In the presently preferred embodiment of invention, rare-earth alkoxide precursors were used in 2-methoxyethanol. The preferred alkoxide being rare-earth methoxyethoxides. An illustrative example of the method is as follows. The rare-earth isopropoxides is reacted with 2-methoxyethanol under an inert atmosphere. After refluxing, a portion of the solution is removed by distillation. The remaining solution is then cooled and additional 2-methoxyethanol is added. The solution was again refluxed, and further portion of the solution was removed by distillation. The process of dilution, reflux, and distillation is repeated for a total of three cycles to ensure the complete exchange of the methoxyethoxide ligand for the isopropoxide ligand.

The final concentration of the solution is adjusted to obtain a 0.5 M solution of rare-earth methoxyethoxide in 2-methoxyethanol. The final coating solutions is prepared by reacting 1 part of a 1.0 molar solution of water in 2-methoxyethanol with 4 parts of the 0.5 M rare-earth methoxyethoxide solution. Hydrolysis was not necessary in some instances.

APPLYING THE COATING SOLUTION TO-THE METAL SUBSTRATE

Any method of applying the coating solution to the metal substrate is acceptable for use with this invention. However, two preferred methods of applying the coating solution to the metal substrate are (i) spin coating and (ii) dip coating. For either of the two preferred methods, the metal substrate can be dipped in a controlled atmosphere or in air.

Spin coating involves spinning the metal substrate at high revolutions per minute (RPM), for example approximately 2,000 RPM, applying the solution onto the metal substrate. Equipment capable of spin coating is known in the art as a spinner. For example spinners are used during semiconductor manufacturing to apply photo-resist to semiconductor wafers. However, the invention is not limited as to a particular type of spinner. Any spinner capable of applying a coating solution to the metal substrate is acceptable for use with this invention. Additionally, so long as coating solution is applied to the metal substrate with the desired thickness and uniformity, the invention is not limited as to any particular process parameters for use with the spinner. In a preferred embodiment of the invention, however, the spinner is operated at about 2000 RPM for a period of about 30 seconds to obtain a continuous coating.

Figure 18A:
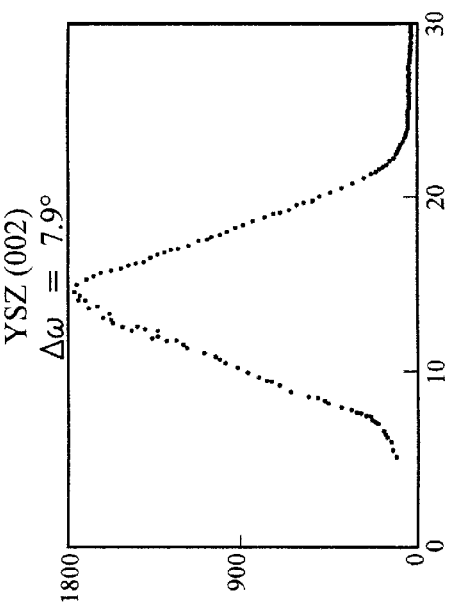
FIGS. 18a and 18b are an omega scan of the YSZ (002) reflection (FWHM=7.9°), and a phi scan of the YSZ (111) reflection (FWHM=10.9°), respectively of the film in FIG. 16.
Figure 18B:
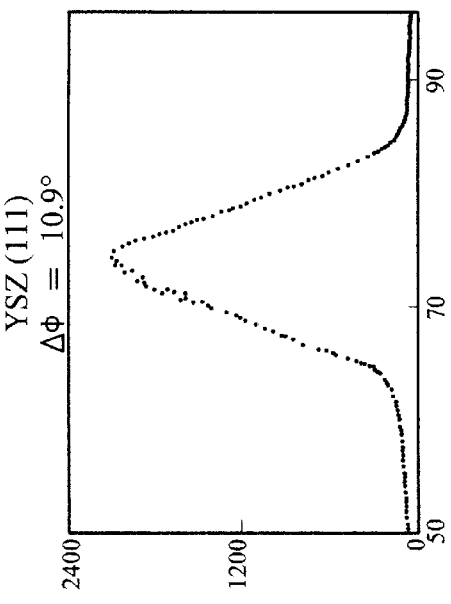
Figure 19A:
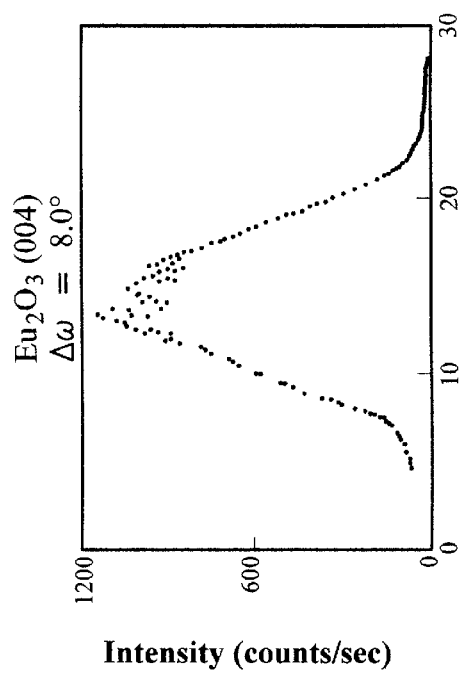
FIGS. 19a and 19b are an omega scan of the $Eu_2O_3$ (004) reflection (FWHM=8.0°), and a phi scan of the $Eu_2O_3$ (222) reflection (FWHM=10.8°), respectively of the film in FIG. 16.
Figure 19B:
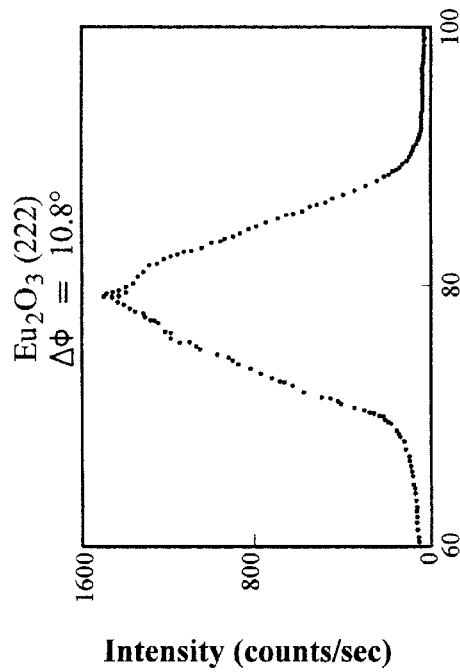
Figure 20A:
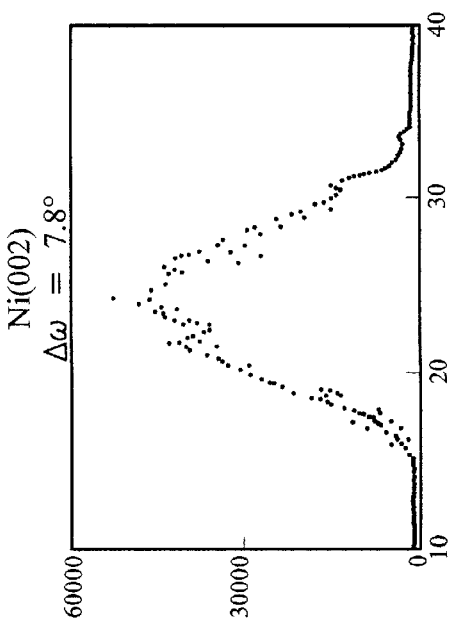
FIGS. 20a and 20b are an omega scan of the Ni (002) reflection (FWHM=7.8°), and a phi scan of the Ni (111) reflection (FWHM=10.3°), respectively of the film in FIG. 16.
Figure 20B:
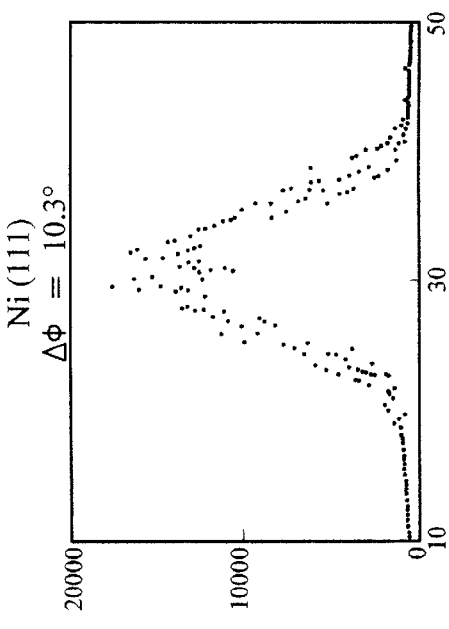

Although any equipment can be used to dip coat the coating solution onto the metal substrate, the preferred equipment is a reel-to-reel dip coating unit as illustrated in FIG. 18. The reel-to-reel dip-coating unit 20 includes a pay-out reel 22, a solution container 24, pulleys 26, and a take-up reel 28. The pay-out reel 22 provides the metal substrate 30 for dipping. The solution container 24 contains the coating solution 32, and the pulleys 26 direct the metal substrate 30 into the coating solution 32 and onto the take-up reel 28.

Also included can be a furnace 34 for heat treatment of the metal substrate 30 and coating solution 32. The furnace 34 is preferably disposed between the solution container 24 and the take-up reel 28. The take-up reel 28 acts to retrieve the metal substrate 30 after being coated with the coating solution 32.

The rate at which the metal substrate 30 is withdrawn from the coating solution 32 depends upon the desired thickness and concentration of the coating solution 32 on the metal substrate 30. As the rate of withdrawal increases, at a given point, depending on the solution and the substrate, the amount of coating solution 32 applied to the metal substrate 30 increases. However, so long as the coating solution 32 is applied to the metal substrate 30 with the desired thickness and consistency, the invention is not limited as to any particular withdrawal rate. In a preferred embodiment of the invention, however, the metal substrate is withdrawn at a rate of about 3 cm/min.

HEAT TREATMENT

The heat treatment process pyrolyzes the coating solution thereby leaving the rare-earth oxide remaining on the metal substrate. The enclosure containing the metal substrate is preferably purged with a reducing atmosphere prior to the beginning of the heat treatment process. Purging the container prior to heat treatment removes undesirable contaminants from the atmosphere within the enclosure. During the heat treatment process, the metal substrate is preferably maintained in a reducing atmosphere to prevent any oxidation of the metal substrate. An inert atmosphere may also be preferably maintained around the metal substrate during cooling. Also, by maintaining the reducing atmosphere around the metal substrate during cooling, oxidation of the metal substrate can be prevented.

The heat treatment process is for a combination of time and temperature sufficient to pyrolyze the coating solution and leaves the desired crystal structure of the rare earth oxide. Any time and temperature combination sufficient to pyrolyze the coating solution and leave the desired crystal structure of the rare earth oxide is acceptable for use with the invention. A more detailed discussion as to the preferred temperature ranges for the various rare earth oxide compounds is included below.

During the heat treatment process, low partial pressures of water and/or oxygen gas can be introduced into the atmosphere surrounding the metal substrate. The addition of water and/or oxygen gas acts as a catalyst for pyrolyzing the coating solution at lower temperatures. Thus, the introduction of low partial pressures of water of oxygen gas into the atmosphere advantageously allows for a lower processing temperature.

Hydrogen containing atmospheres are the preferred atmospheres for the heat treatment of the coated substrates, with 4% v/v hydrogen in argon, helium, or nitrogen the most preferred atmosphere for safety reasons. Mixtures of 2–6% v/v hydrogen are commonly referred to as "forming gas" and are not generally combustible under most conditions. Carbon monoxide/carbon dioxide mixtures are also commonly used as gaseous reducing agents.

Any furnace capable of producing the desired temperature and time parameters is acceptable for use with this invention. Additionally, any enclosure for the metal substrate capable of preventing contamination of the metal substrate is acceptable for use with this invention. However, the presently preferred enclosure is equipped with gas fixtures for receiving the reducing atmosphere.

An illustrative example of the preferred heat treatment process follows, it is being understood that the practice of the invention is not limited in this manner. The coated metal substrate is placed in a quartz tube equipped with a gas inlet and outlet. A bottled gas mixture containing 4% hydrogen in 96% argon is then allowed to flow into the quartz tube for 20–30 minutes at room temperature. At the same time, the furnace is preheated to the desired temperature. The quartz tube is then introduced into the furnace and heated for a period of approximately one hour. After heating, the metal substrate is quenched to room temperature by removing the quartz tube from the furnace. During quenching the flow of 4% hydrogen in 96% argon gas mixture is maintained.

CRYSTAL STRUCTURE

Three types of crystal structures are known for the rare earth oxides (Henry R. Hoekstra, Inorg. Chem. 5, 755 (1966)). These crystal structures are hexagonal (type A), monoclinic (type B), and cubic (type C). Type A (hexagonal) has a space group of p3m1 and contains one molecule per unit cell or P63/MMC, containing two molecules per unit. Each trivalent cation is bonded to seven oxygen atoms (four short bonds and three long bonds), while the two types of oxygen atoms are bonded to five and four metal atoms, respectively.

Type B (monoclinic) has a space group of C2/m, and contains six molecules per unit cell, and also shows sevenfold cation coordination. The crystal lattice has three different cation sites and five different anion sites which bond to four, five or six metal atoms.

Type C (cubic) has a space group of Ia3, with 16 molecules per unit cell. It is derived from the fluorite ($CaF_2$) structure by doubling the lattice parameter and by removing one fourth of the oxygen ions to maintain the charge neutrality between $RE^{3+}$ and $O^{2-}$. The crystal lattice has two kinds of six fold coordinated RE ions.

Figure 17A:
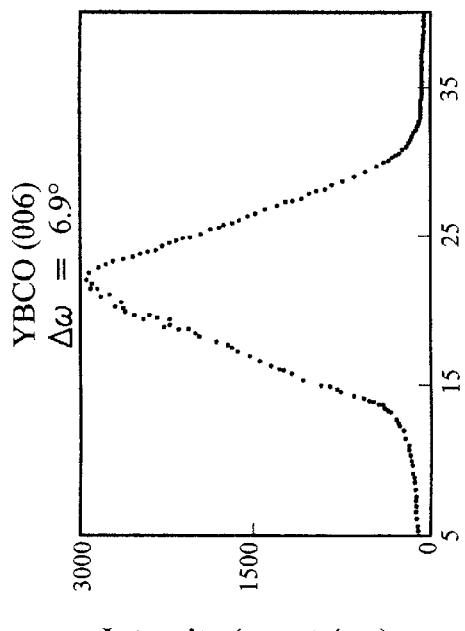
FIGS. 17a and 17b are an omega scan of the YBCO (006) reflection (FWHM=6.9°), and a phi scan of the YBCO (103) reflection (FWHM=10.5°), respectively of the film in FIG. 16.
Figure 17B:
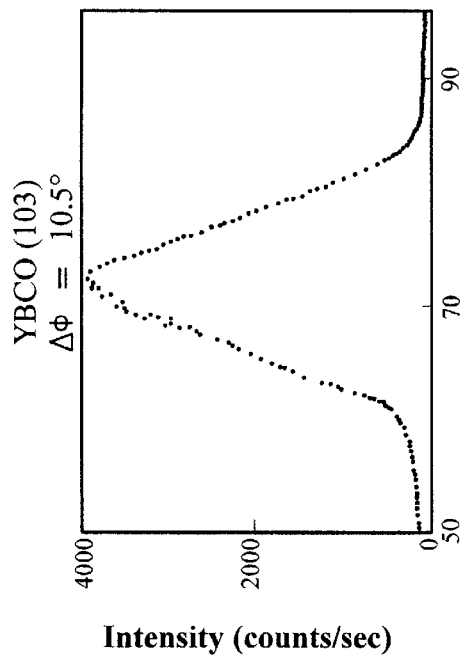

Structural stability relationships for these three structure types for $RE_2O_3$ are shown in FIG. 17. The symbol A represents the hexagonal structure, symbol B represents the monoclinic structure, and symbol C represents the cubic structure. The A-B phase boundary line is vertical, independent of temperature and lies between neodymium and samarium. The B-C phase boundary is fairly well understood, and further extension of the line to higher temperatures is prevented by fusion of the rare earth oxides. Thus, $Y_2O_3$ and the five heaviest rare earth oxides namely $Ho_2O_3$, $Er_2O_3$, $Tm_2O_3$, $Yb_2O_3$, and $Lu_2O_3$ exist in only the cubic form at ambient pressures. Also, the B-C phase boundary is completely reversible for pure $Dy_2O_3$, $Tb_2O_3$, and $Gd_2O_3$, and for $Eu_2O_3$, and $Sm_2O_3$ in the presence of water as catalyst. The exact locations of these phase boundaries for $RE_2O_3$ films are under further investigation.

TEMPERATURE TABLE

Table 1 illustrates the approximate temperature ranges to which the heat treating process will heat the rare-earth oxide solution. The temperature range is equivalent to the temperature range at which the as-grown oxide film has a cubic crystal structure.

TABLE 1

| Composition | Temperature Range (° C.) |
| --- | --- |
| $Nd_2O_3$ | 600–800 |
| $Sm_2O_3$ | 600–1000 |
| $Eu_2O_3$ | 600–1100 |
| $Ho_2O_3$ | 600–1455 |
| $Er_2O_3$ | 600–1455 |
| $Lu_2O_3$ | 600–1455 |
| $Y_2O_3$* | 600–1455 |
| $Gd_2O_3$ | 600–1200 |
| $Tb_2O_3$ | 600–1455 |
| $Dy_2O_3$ | 600–1455 |
| $Tm_2O_3$ | 600–1455 |
| $Yb_2O_3$ | 600–1455 |
| $CeO_2$** | 600–1455 |

*Not rare-earth oxides
**Does not have $RE_2O_3$ structure.

EXAMPLE 1

Gadolinium isopropoxide was synthesized using the method of Brown et al. The $Gd_2O_3$ precursor solution was prepared by reacting 4.85 g (15 mmole) of gadolinium isopropoxide with 50 ml of 2-methoxyethanol under an inert atmosphere. After refluxing for approximately 1 hour, two-thirds of the solution (isopropanol and 2-methoxyethanol) was removed by distillation. The flask was allowed to cool, and 20 ml of 2-methoxyethanol was added. The flask was refluxed for 1 hour, and ⅔ of the solution was then removed by distillation. This process of dilution, reflux, and distillation was repeated for a total of three cycles to ensure the complete exchange of the methoxyethoxide ligand for the isopropoxide ligand. It was estimated that this occurs when the boiling point of the solution reaches 124° C. The final concentration of the solution was adjusted to obtain a 0.5 M solution of gadolinium methoxyethoxide in 2-methoxyethanol. A partially hydrolyzed solution suitable for spin coating or dip-coating was prepared by reacting 1 part of a 1.0 molar solution of water in 2-methoxyethanol with 4 parts of the 0.5 M gadolinium methoxyethoxide solution.

Strips of roll-textured nickel were cleaned by ultrasonification for 1 hour in isopropanol that had been dried over aluminum isopropoxide and distilled under inert gas. The coating of the nickel was accomplished using spin coating at 2000 RPM for 30 seconds or dip coating with a withdrawal velocity of 3 cm/min.

The nickel substrates were placed in a quartz tube equipped with a gas inlet and outlet. A bottled gas mixture containing 4% hydrogen in 96% argon was allowed to flow for 20–30 minutes at room temperature. At the same time, a tube furnace was preheated at the desired temperature of 1160° C. This temperature could be reduced to 800–900° C. by the addition of approximately 150 ppm of $O_2$. The quartz tube containing the coated substrate was then introduced into the furnace and heated for periods varying from 5 minutes to 1 hour.

After heat treatment, the coated substrate was quenched to room temperature by removing the quartz tube out of the furnace. During this time, a gas mixture of 4% hydrogen and 96% argon was continually flowing through the quartz tube.

Highly crystalline gadolinium oxide ($Gd_2O_3$) film on roll-textured Ni substrates was obtained. The texture of films were analyzed by X-ray diffraction (XRD), and film microstructure was analyzed using scanning electron microscope (SEM), and electron back scatter Kikuchi patterns (EBKP).

Figure 7:
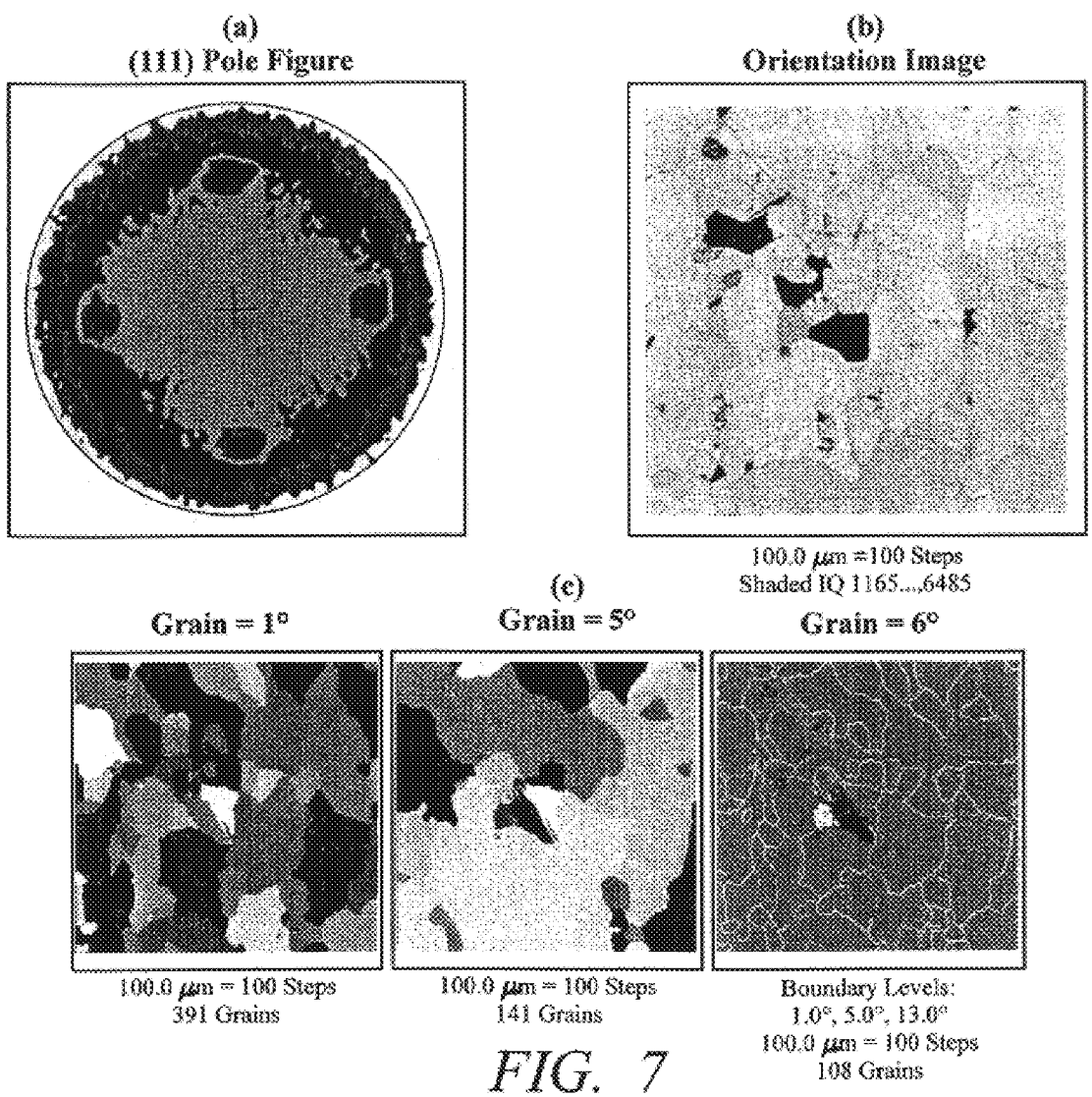
Figure 8:
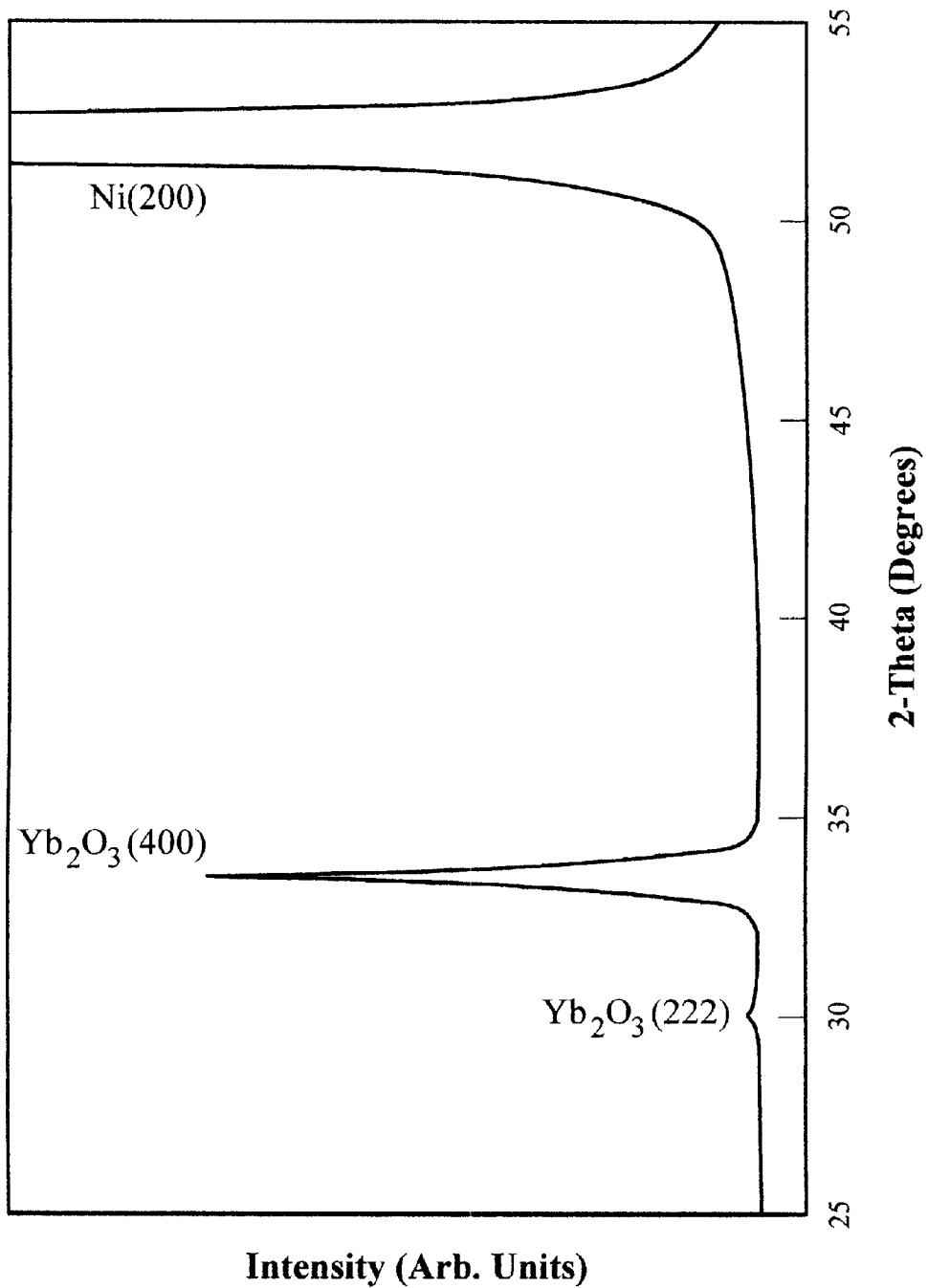
FIG. 8 is a theta-2-theta scan of c-axis oriented $Yb_2O_3$ film on Ni (100) substrate.
Figure 9:
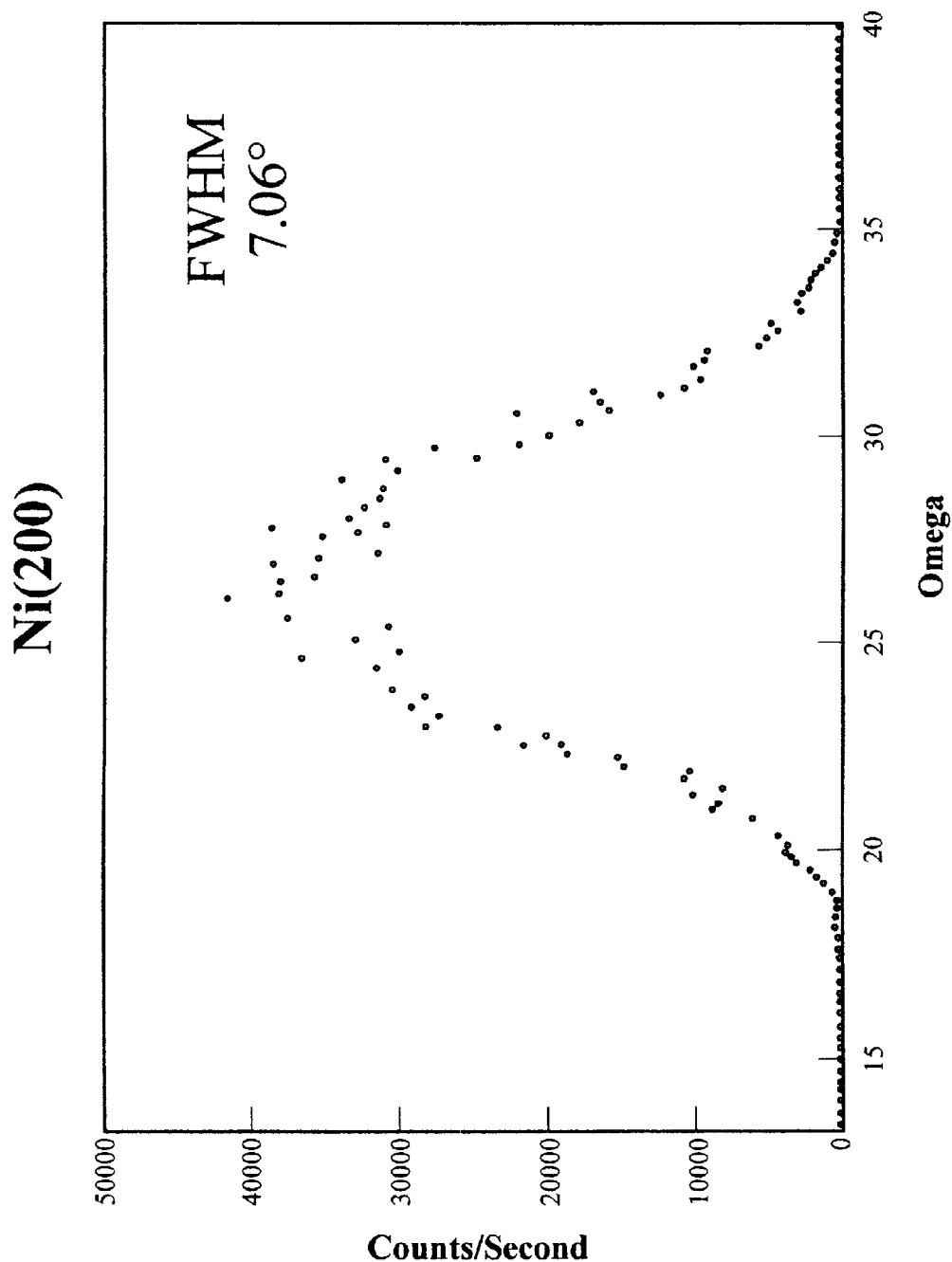
FIG. 9 is an omega scan of the Ni (002) reflection (FWHM=7.06°) of a 2000 Å thick $Yb_2O_3$ film on a roll-textured Ni substrate.
Figure 10:
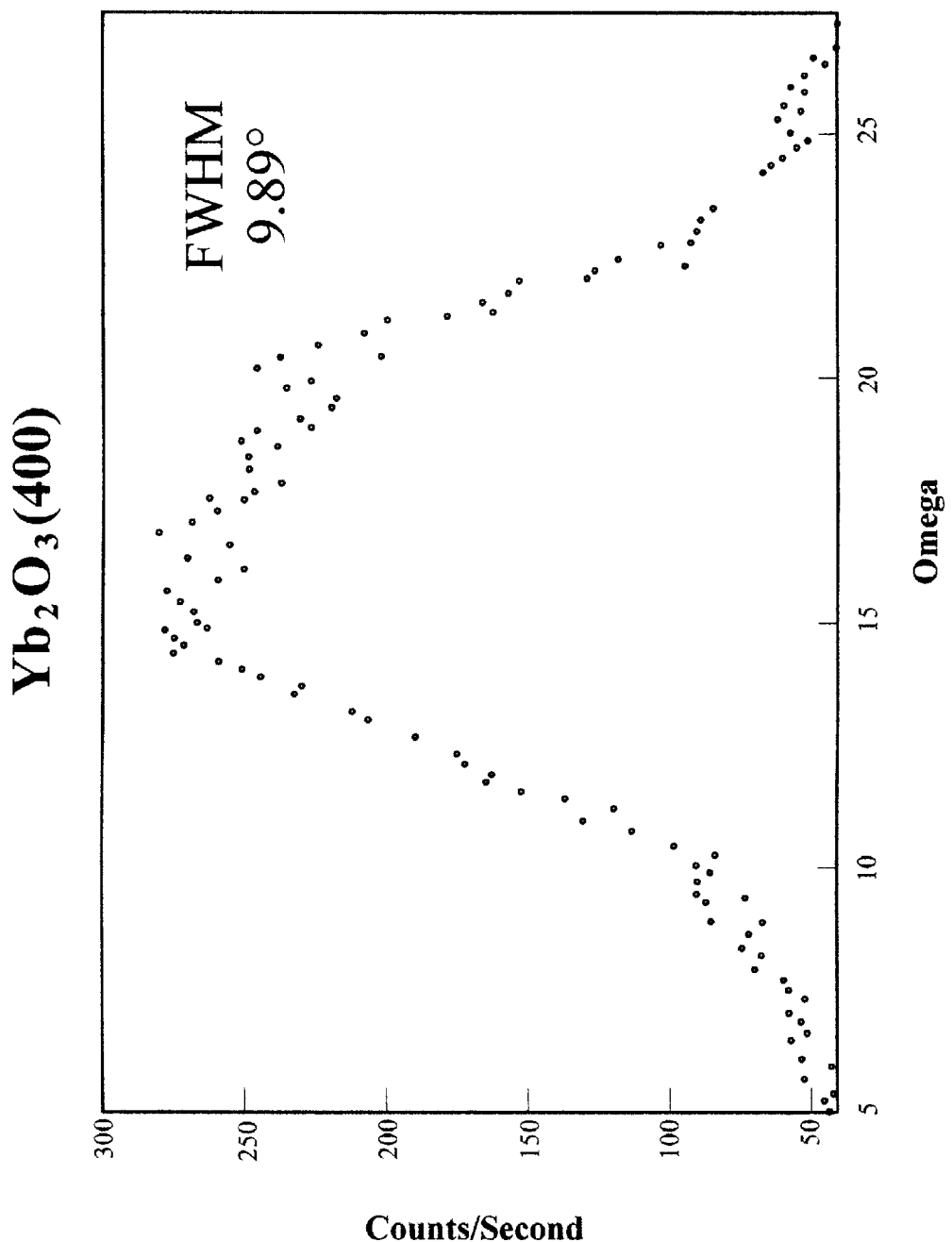
FIG. 10 is an omega scan of the $Yb_2O_3$ (004) reflection (FWHM=9.890) of a 2000 Å thick $Yb_2O_3$ film on a roll-textured Ni substrate.
Figure 11:
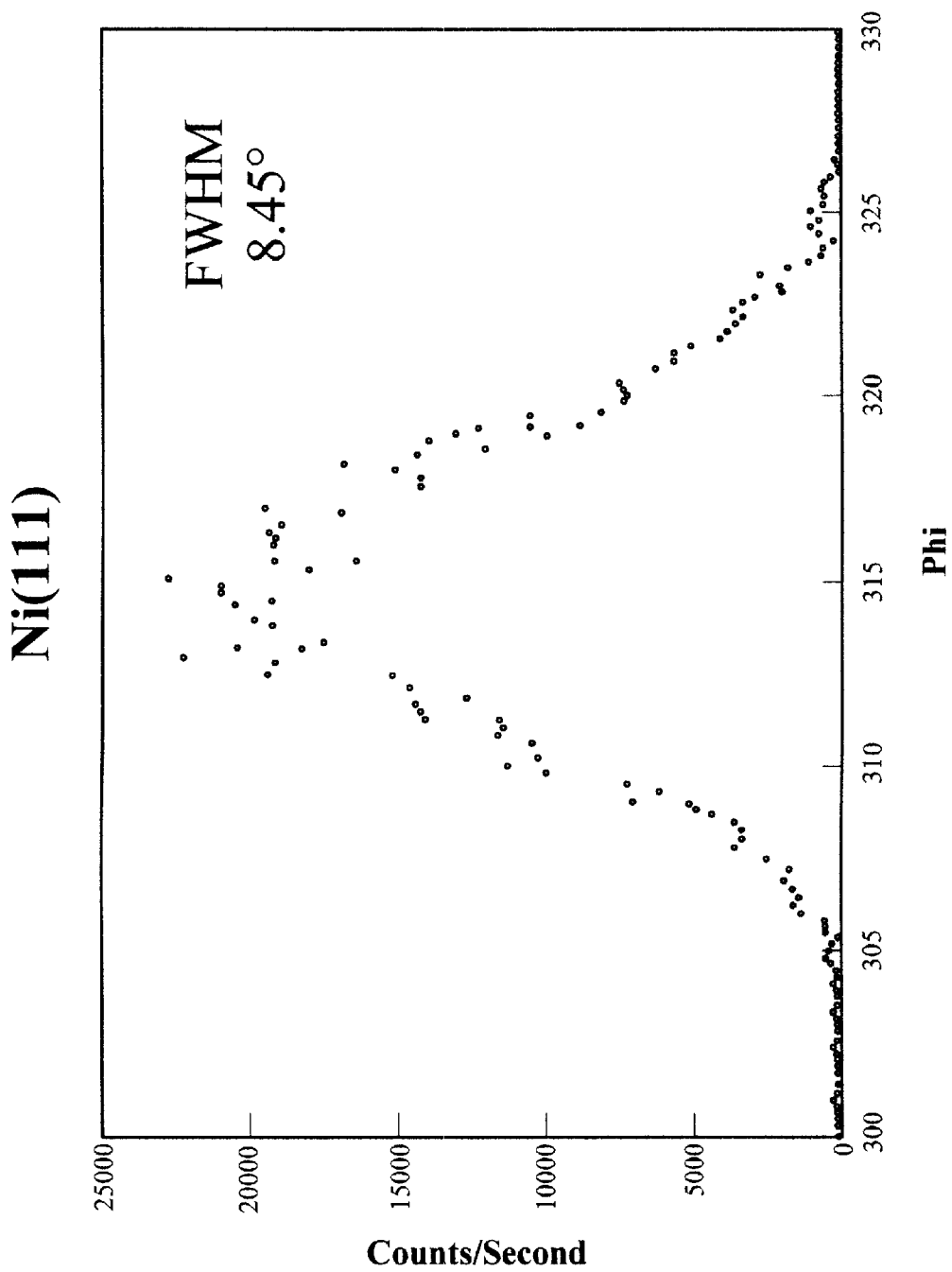
FIG. 11 is a phi scan of the Ni (111) reflection (FWHM=8.45°) of a 2000 Å thick $Yb_2O_3$ film on a roll-textured Ni substrate.
Figure 12:
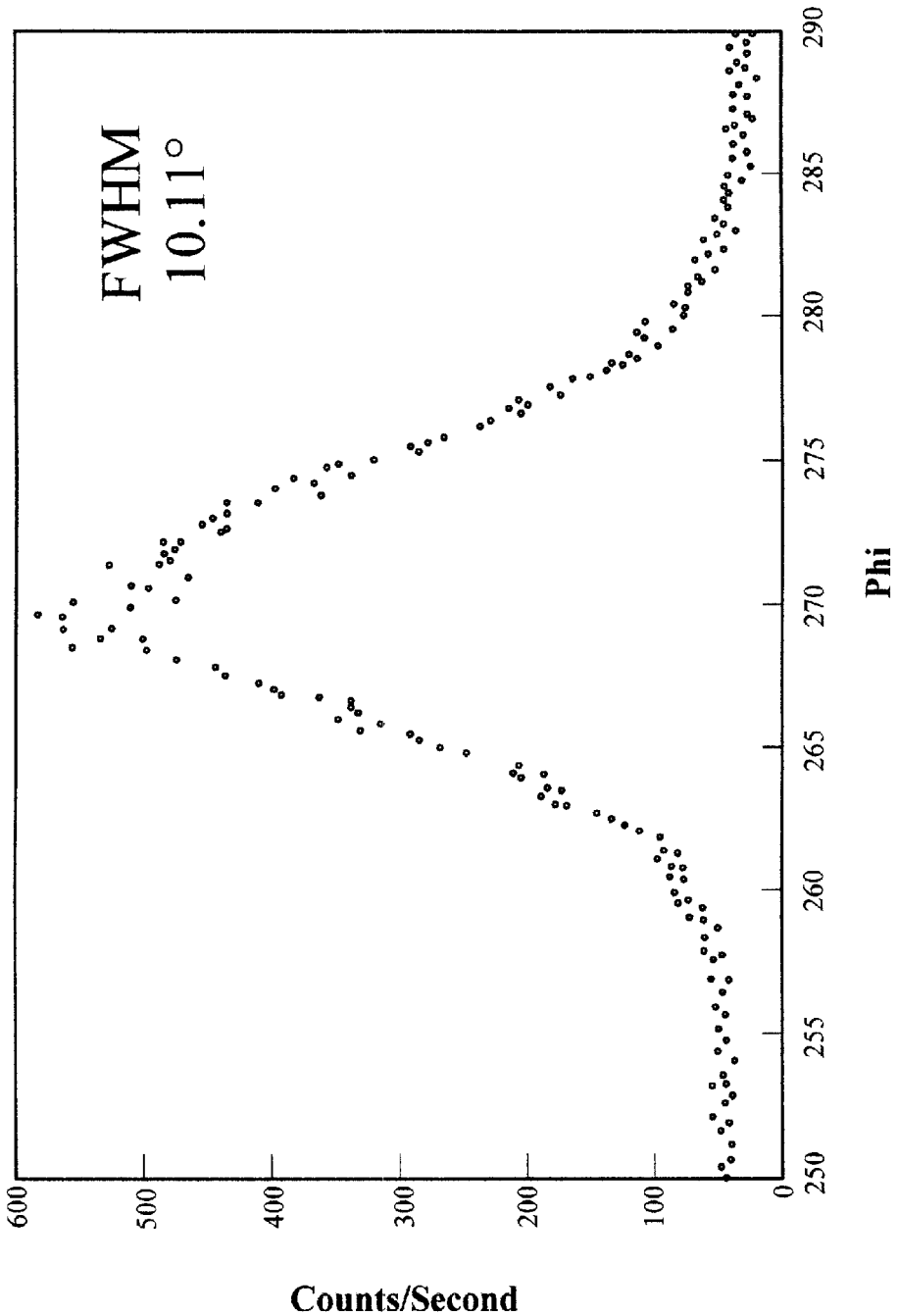
FIG. 12 is a phi scan of the $Yb_2O_3$ (222) reflection (FWHM=10.11°) of a 2000 Å thick $Yb_2O_3$ film on a roll-textured Ni substrate.
Figure 13:
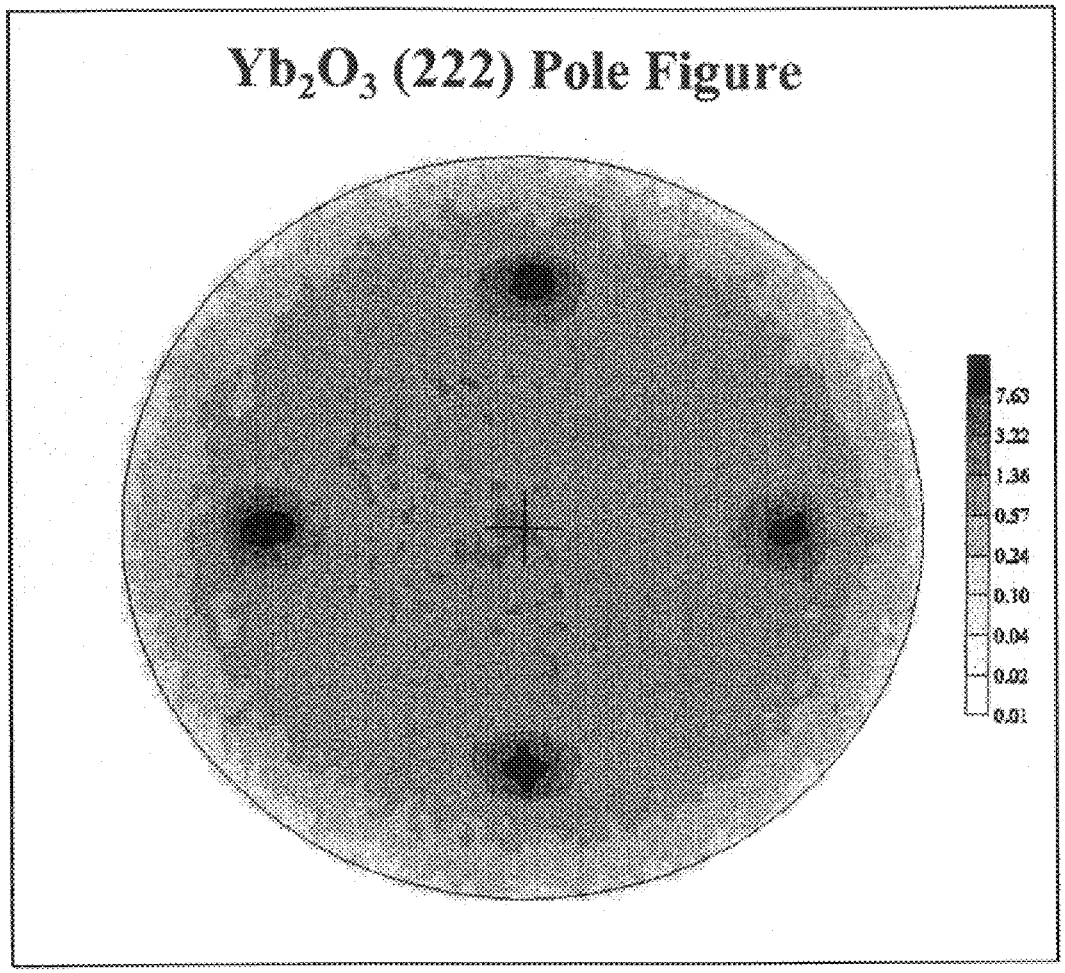
FIG. 13 is the $Yb_2O_3$ (222) pole figure of a 2000 Å thick sol-gel $Yb_2O_3$ film on roll-textured Ni substrate.
Figure 14:
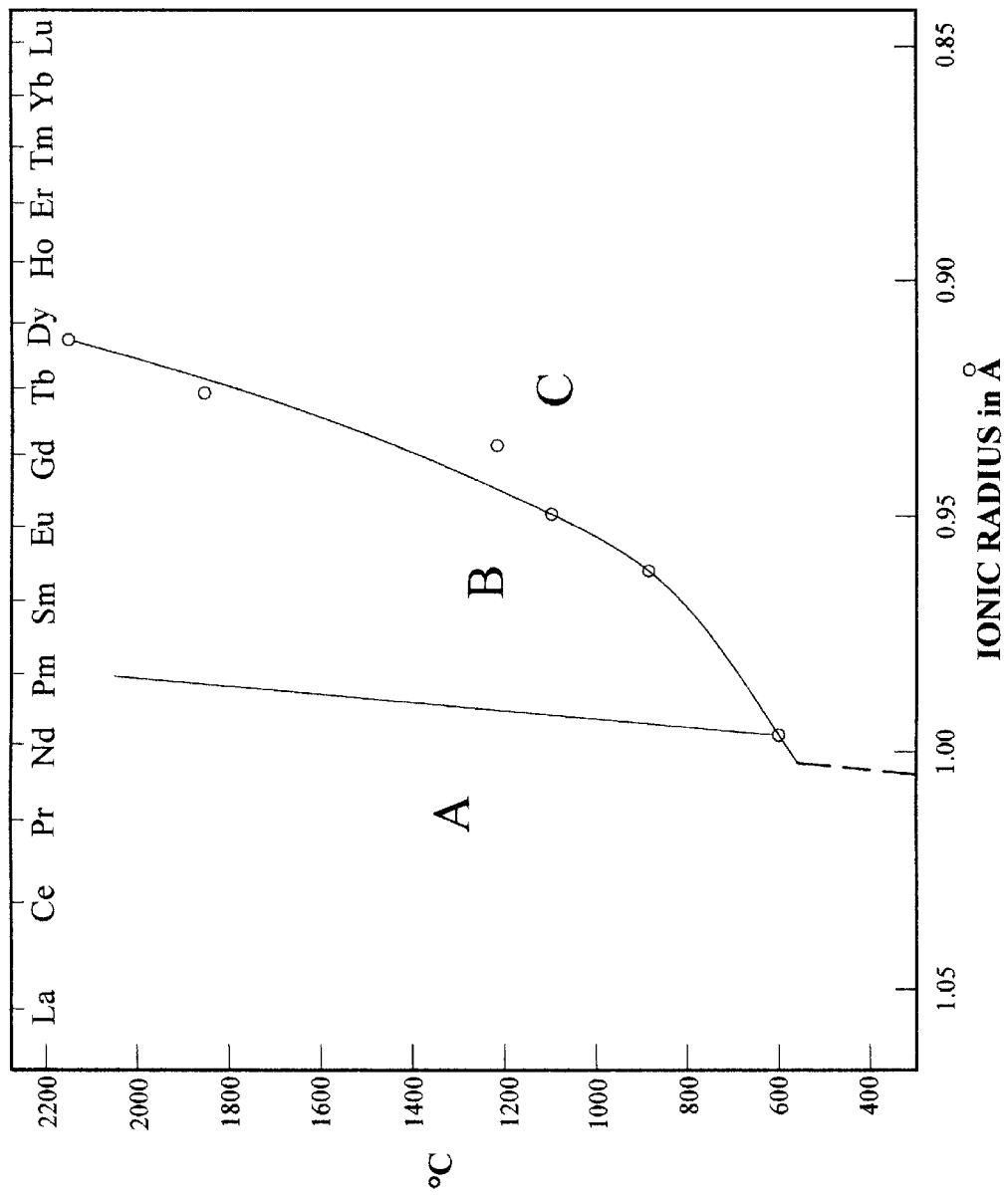
FIG. 14 is a structural stability relationship graph for $Re_2O_3$ wherein symbol A represents the hexagonal structure, symbol B represents the monoclinic structure, and symbol C represents the cubic structure.
Figure 15:
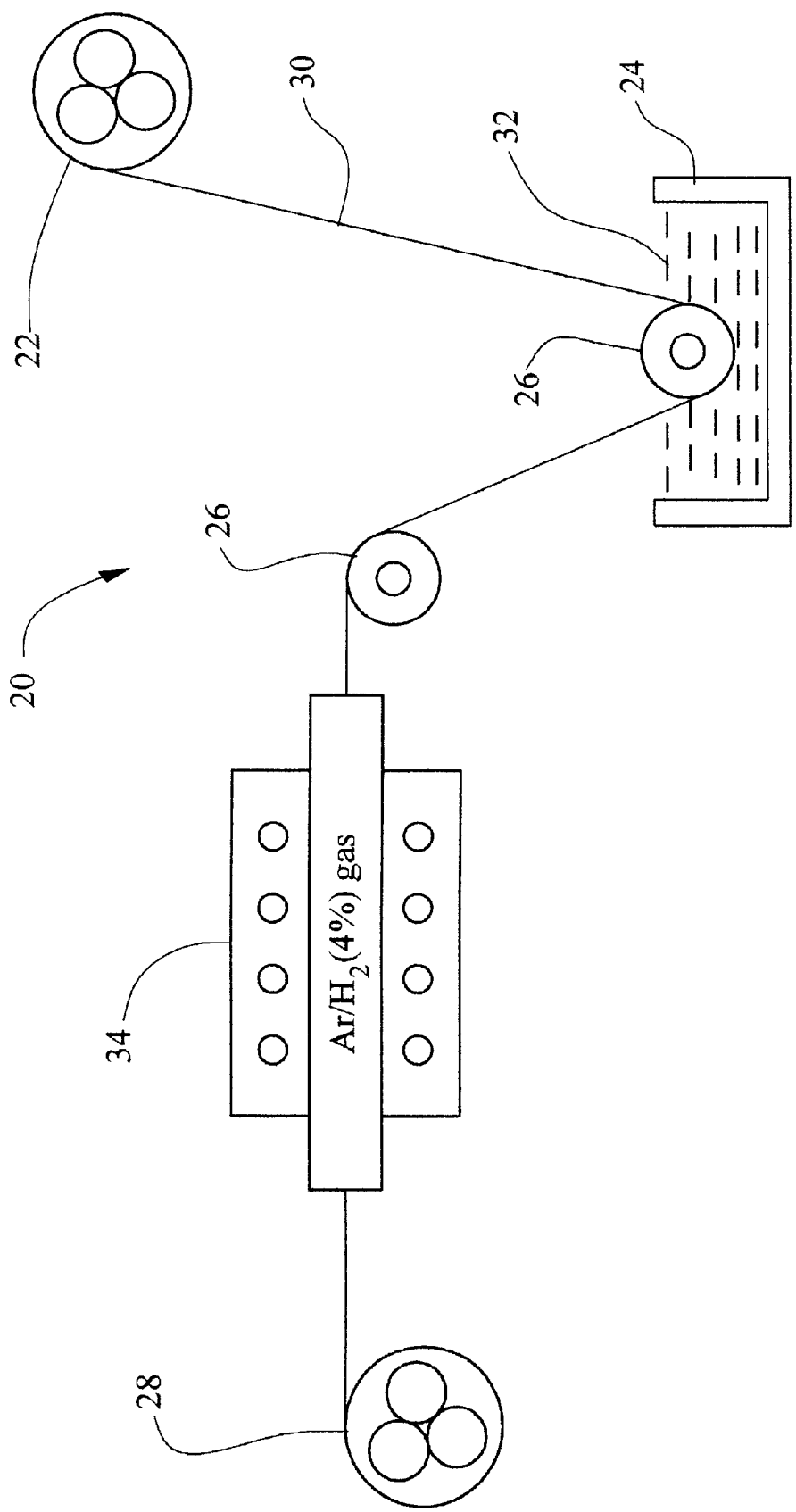
FIG. 15 is a schematic of a reel-to-reel continuous dip-coating unit.

FIGS. 2–7 illustrate the XRD data for a 600 Å thick sol-gel grown $Gd_2O_3$ film that was heat-treated at 1160° C. in a flowing gas mixture of 4% $H_2$ and 96% Ar on roll-textured Ni substrate. The strong (004) peak of $Gd_2O_3$ in FIG. 2 indicates the presence of a strong c-axis aligned film. The omega and phi scans of FIGS. 3–6 and the $Gd_2O_3$ (222) pole figures of FIG. 7 indicate the presence of a single in-plane textured $Gd_2O_3$ film. A SEM micrograph indicated the presence of a dense and crack-free microstructure. FIG. 7 shows the (222) pole figures observed for $Gd_2O_3$ on textured Ni. A single orientation of $Gd_2O_3$ film is evident. The orientation image micrographs for the $Gd_2O_3$ film shown in FIG. 7 indicate the grains are well connected by boundaries less than 6 degrees.

EXAMPLE 2

Ytterbium isopropoxide was synthesized using the method of Brown et al. A flask containing 4.85 g (15 mmole) of ytterbium isopropoxide was reacted with 50 ml of 2-methoxyethanol under an inert atmosphere. After refluxing for approximately 1 hour, two-thirds of the solution (isopropanol and 2-methoxyethanol) was removed by distillation. The flask was allowed to cool, and 20 ml of 2-methoxyethanol was added. The flask was refluxed for 1 hour, and ⅔ of the solution was then removed by distillation. This process of dilution, reflux, and distillation was repeated for a total of three cycles to ensure the complete exchange of the methoxyethoxide ligand for the isopropoxide ligand. It was estimated that this occurs when the boiling point of the solution reaches 124° C. The final concentration of the solution was adjusted to obtain a 0.5 M solution of ytterbium methoxyethoxide in 2-methoxyethanol. Coating solutions were prepared by reacting 1 part of a 1.0 molar solution of water in 2-methoxyethanol with 4 parts of the 0.5 M ytterbium methoxyethoxide solution.

Strips of roll-textured nickel were cleaned by ultrasonification for 1 hour in isopropanol that had been dried over aluminum isopropoxide. The coating of the nickel was accomplished using spin coating at 2000 RPM for 30 seconds or dip coating with a withdrawal velocity of 3 cm/min.

The nickel substrates were placed in a quartz tube equipped with a gas inlet and outlet. A bottled gas mixture containing 4% hydrogen in 96% argon was allowed to flow for 20–30 minutes at room temperature. At the same time, a tube furnace was preheated at the desired temperature of 1160° C. This temperature could be reduced to 800–900° C. by the addition of approximately 150 ppm of $O_2$. The quartz tube with the coated substrate was then introduced into the furnace and heated for periods varying from 5 minutes to 1 hour.

After heat treatment, the coated substrate was quenched to room temperature by removing the quartz tube out of the furnace. During this time, a gas mixture of 4% hydrogen and 96% argon was continually flowing through the quartz tube.

Highly crystalline ytterbium oxide ($Yb_2O_3$) film on roll-textured Ni substrates was obtained. The texture of films was analyzed by X-ray diffraction (XRD), and film microstructure was analyzed using scanning electron microscope (SEM), and electron backscatter Kikuchi patterns (EBKP).

FIGS. 8–13 illustrate the XRD data for a 600 Å thick sol-gel grown $Yb_2O_3$ film that was heat-treated at 1160° C. in a flowing gas mixture of 4% $H_2$ and 96% Ar on roll-textured Ni substrate. The strong (004 peak of $Yb_2O_3$ in FIG. 8 indicates the presence of a strong c-axis aligned film. The omega and phi scans and $Yb_2O_3$ (222) pole figures indicate the presence of a single in-plane textured $Yb_2O_3$ film.

EXAMPLE 3

In a preferred embodiment of the invention, europium oxide $Eu_2O_3$ films were epitaxially grown on textured Ni substrates at around 1050° C. in the presence of a 4% hydrogen and 96% argon gas mixture. The metal substrate was dip coated from a 0.1 to 0.5 M solution of europium methoxyethoxide in 2-methoxyethanol. The dip-coated substrate was placed in a quartz tube and purged with a gas mixture of 4% hydrogen and 96% argon for 20–30 min at room temperature. At the same time, the furnace was preheated to 1050° C. The quartz tube with the metal substrate was introduced into the furnace and heated for approximately 1 hour.

After heat treatment, the coated substrate was quenched to room temperature by removing the quartz tube out of the furnace. During this time, a gas mixture of 4% hydrogen and 96% argon was continually flowing through the quartz tube.

By introducing water (dew point of approximately 25° C.; wet gas) or low partial pressures of oxygen gas (preferably 100 mTorr oxygen) into the quartz tube along with 4% hydrogen and 96% argon gas mixtures, textured $Gd_2O_3$ and $Eu_2O_3$ films have been produced at 800° C.

EXAMPLE 4

Figure 16:
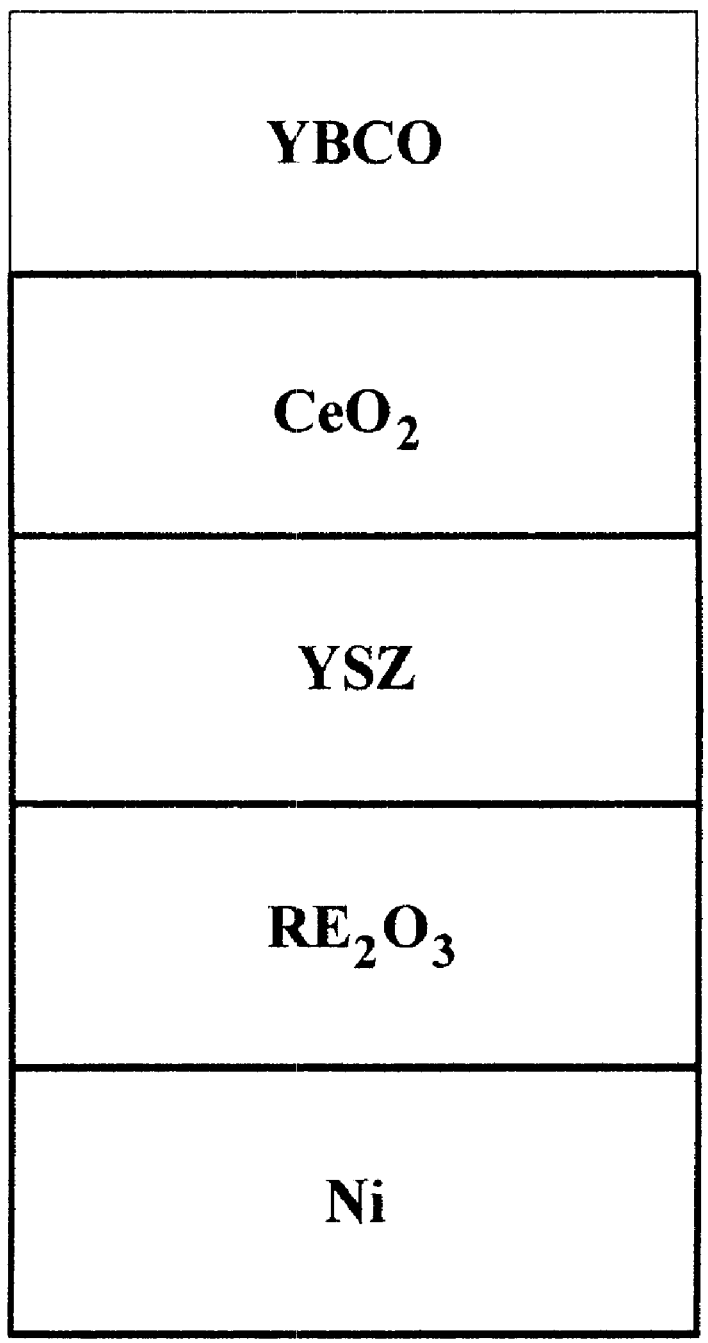
FIG. 16 is a schematic of a high $J_c$ YBCO film having as layers: YBCO, $CeO_2$, YSZ, $Re_2O_3$, and Ni.

FIG. 16 illustrates the following architecture used to demonstrate the growth of a high $J_c$ YBCO film 40 having as layers: YBCO 42, $CeO_2$ 44, YSZ 46, $Eu_2O_3$ 48, and Ni 50. The YBCO layer 42 was applied using an ex-situ $BaF_2$ process. The $CeO_2$ 44 and the YSZ 46 layers were applied using sputtering. The $Eu_2O_3$ 48 layer was applied by dip coating.

After preparing a biaxially textured Ni substrate 50, the substrate 50 was immersed in an $Eu_2O_3$ precursor solution (Europium methoxyethoxide) and then withdrawn at a rate of 3 cm/min in a linear dip-coating unit. After coating, the Ni substrate 50 was annealed in a mixture of 4% $H_2$ and 96% Ar at a temperature of 1060° C. for one hour and quenched to room temperature.

The rf magnetron sputtering technique was used to grow YSZ 46 and $CeO_2$ 44 cap layers on the $Eu_2O_3$-buffered Ni substrates 48, 50 at 780° C. The plasma power was 75 W at 13.56 MHz. The resulting YSZ 46 and $CeO_2$ 44 films were smooth and dense. Precursor YBCO films 42 were grown on the $CeO_2$-buffered YSZ/$Eu_2O_3$ (dip-coated)/Ni substrates 44, 46, 48, 50 by electron beam co-evaporation of Y, $BaF_2$, and Cu at a combined deposition rate of approximately 6 Å/sec.

Figure 21:
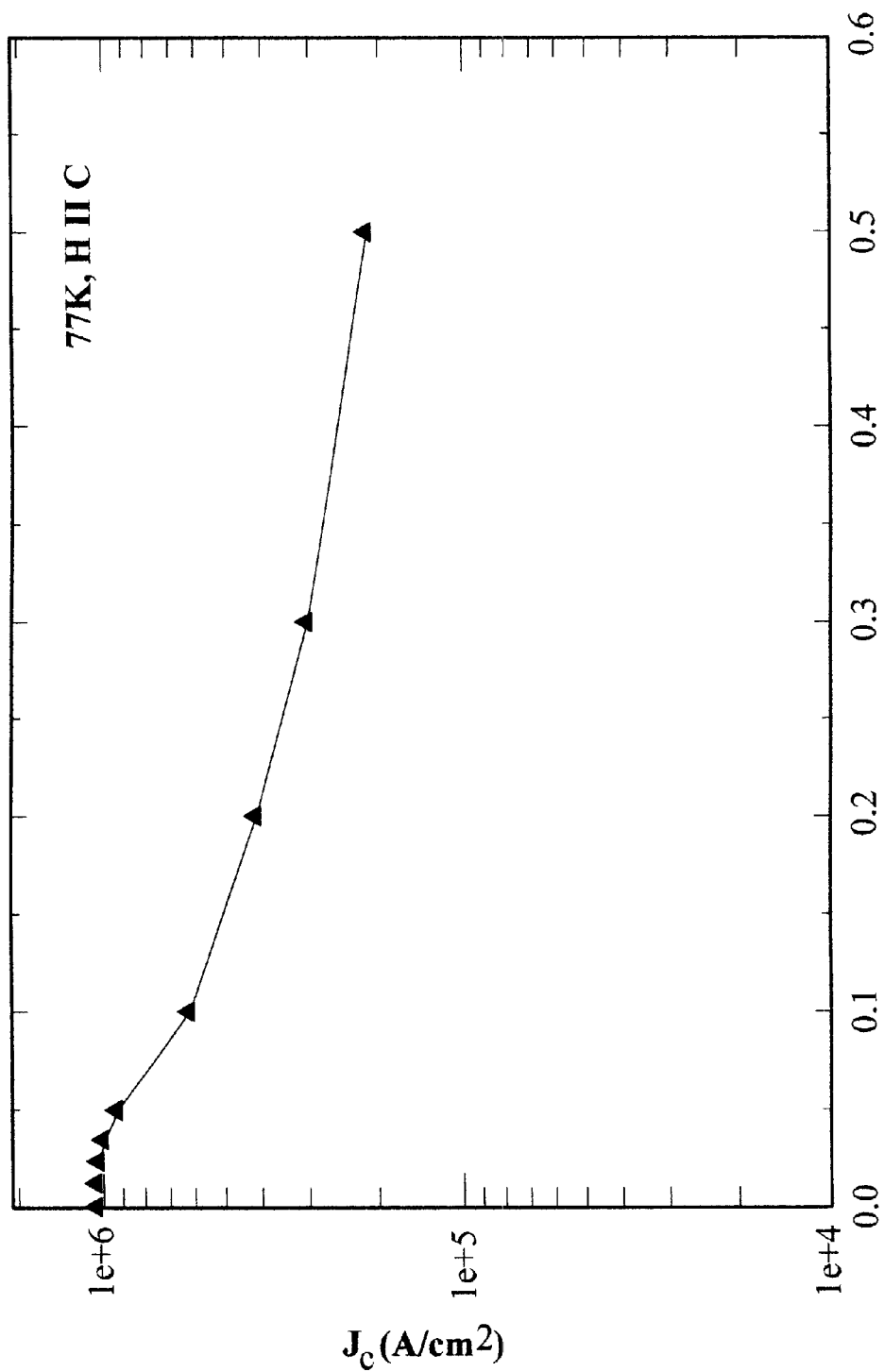
FIG. 21 is a graph illustrating the field dependence of the JC for 300 nm thick film having an architecture according to FIG. 16 where RE=Eu.

The q-2q scan of the YBCO film 50 indicated the presence of a c-axis aligned film. FIGS. 17a–20a and 17b–20b respectively illustrate the XRD results from omega and phi scans on the YBCO/$CeO_2$/YSZ/$Eu_2O_3$ (dip-coated)/Ni. The FWHM values for Ni (002), $Eu_2O_3$ (004), YSZ (002) and YBCO (006) are 7.8°, 8.0°, 7.9° and 6.9°, and those of Ni (111), $Eu_2O_3$ (222), YSZ (111) and YBCO (103) are 10.3°, 10.8°, 10.9° and 10.5°, respectively. The simulation indicates that the film thickness for $Eu_2O_3$ 48, YSZ 46, $CeO_2$ 44, and YBCO 42 are 60 nm, 295 nm, 10 nm and 300 nm, respectively. The room temperature resistivity of the 300 nm thick YBCO film 40 on $CeO_2$/YSZ/$Eu_2O_3$ (dip-coated)/Ni was low and the $T_c$ measured was about 90 K. The field dependence of $J_c$ for the same film 40 is shown in FIG. 21. The zero field $I_c$ measured was 16 A which translates to a $J_c$ of 1.1 $MA/cm^2$. The $J_c$ at 0.5 T is about 20% of the zero field $J_c$.

Figure 23:
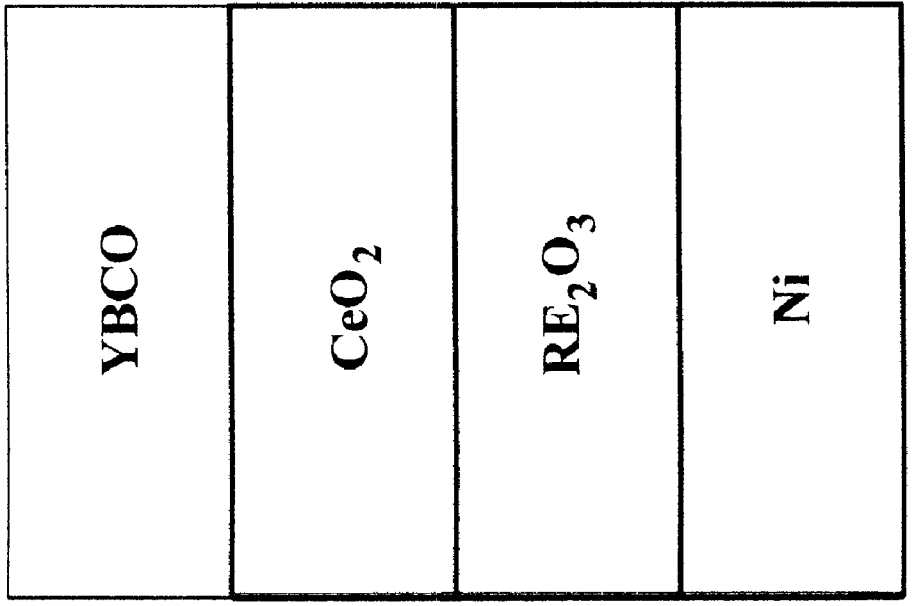
FIG. 23 is a schematic of a high $J_c$ YBCO film having as layers: YBCO, $CeO_2$, $RE_2O_3$, and Ni.
Figure 22:
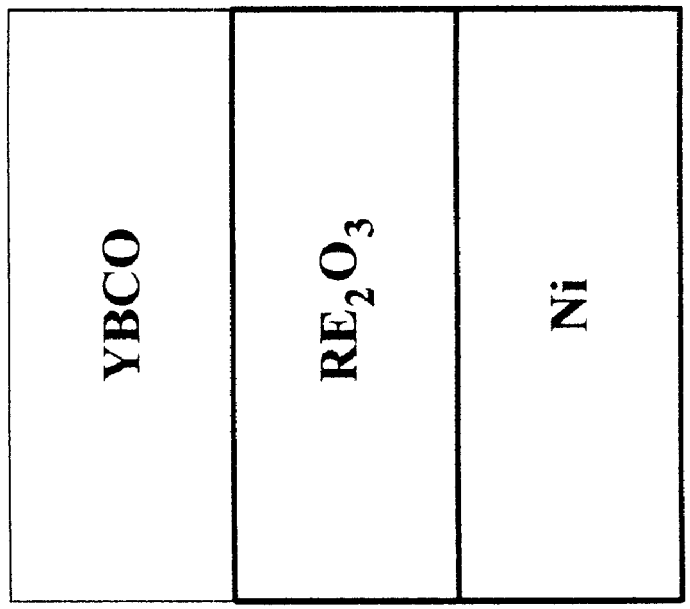
FIG. 22 is a schematic of a high $J_c$ YBCO film having as layers: YBCO, $RE_2O_3$, and Ni.

As illustrated in FIGS. 22 and 23, in addition to the architecture illustrated in FIG. 16 (YBCO/$CeO_2$/YSZ/$RE_2O_3$/Ni) described above, it is possible to develop two new alternative architectures: (A) YBCO 60, $RE_2O_3$ 62, and Ni 64 (FIG. 22) and (B) YBCO 70, $CeO_2$, 72, $RE_2O_3$, 74, and Ni 76 (FIG. 23).

OTHER EXAMPLES

Textured $Sm_2O_3$ has been grown on Ni substrates at 900° C. in the presence of 4% hydrogen and 96% argon gas mixture using sol-gel alkoxide precursors. C-axis aligned mixed rare earth oxides, $(RE^1RE^2)_2O_3$ (for example, $(Sm_{0.6}Eu_{0.4})_2O_3$) have also been grown at around 900° C. on textured Ni substrates. Rare earth oxide biaxially textured buffer layers can be formed with a single rare earth element or a mixture of rare earth elements. Using solution techniques disclosed herein, rare earth biaxially textured buffer layers having the formula $(RE^1_xRE^2_{(1-x)})_2O_3$ can be formed on substrates, wherein $0 \leq x \leq 1$ and $RE^1$ and $RE^2$ are each selected from the group consisting of Nd, Sm, Eu, Ho, Er, Lu, Gd, Tb, Dy, Tm, and Yb. In general, any solid solution of any rare-earth element oxides may be used in this process as long as the solution has a cubic structure in the temperature range of 600 to 1455° C. Also, more than two rare earth element oxides with the cubic structure can be used. In addition, epitaxial $CeO_2$ films on $Eu_2O_3$ (sol-gel) have been grown on buffered Ni substrates at 1050° C. using Ce methoxyethoxide precursors. Epitaxial $CeO_2$ was also grown directly on textured Ni.

Epitaxial $RE_2O_3$ layers can also be applied using multiple coating steps in which a first epitaxial $RE_2O_3$ layer is applied to a substrate and subsequent epitaxial $RE_2O_3$ layers are applied on top of the first layer using the method according to the invention. Alternatively, epitaxial islands of $RE_2O_3$ templates can be produced on textured Ni substrates followed by a continuous layer of epitaxial $RE_2O_3$ layers using the method according to the invention.

What is claimed is:

1. A laminate article, comprising:
   a substrate;
   a biaxially textured $(RE^1_x RE^2_{(1-x)})_2O_3$ buffer layer over said substrate, wherein $0 \leq x \leq 1$ and $RE^1$ and $RE^2$ are each selected from the group consisting of Nd, Sm, Eu, Ho, Er, Lu, Gd, Tb, Dy, Tm, and Yb.

2. The laminate article according to claim 1, wherein x=1.

3. The laminate article according to claim 1, wherein said $(RE^1_x RE^2_{(1-x)})_2O_3$ buffer layer is deposited using sol-gel.

4. The laminate article according to claim 1, wherein said $(RE^1_x RE^2_{(1-x)})_2O_3$ buffer layer is deposited using metal-organic decomposition.

5. The laminate article according to claim 1, further comprising a layer of YBCO over said $(RE^1_x RE^2_{(1-x)})_2O_3$ buffer layer.

6. The laminate article according to claim 5, wherein said YBCO layer is on a surface of said $(RE^1_x RE^2_{(1-x)})_2O_3$ buffer layer.

7. The laminate article according to claim 5, further comprising a layer of $CeO_2$ between said YBCO layer and said $(RE^1_x RE^2_{(1-x)})_2O_3$ buffer layer.

8. The laminate article according to claim 7, further comprising a layer of YSZ between said $CeO_2$ layer and said $(RE^1_x RE^2_{(1-x)})_2O_3$ buffer layer.

9. The laminate article according to claim 1, wherein said substrate is biaxially textured.

10. The laminate article according to claim 9, wherein said substrate is selected from the group consisting of nickel, copper, iron, aluminum, and alloys containing any of the foregoing.

* * * * *